United States Patent
Look et al.

(10) Patent No.: US 6,716,653 B2
(45) Date of Patent: Apr. 6, 2004

(54) MASK ALIGNMENT STRUCTURE FOR IC LAYERS

(75) Inventors: Kevin T. Look, Fremont, CA (US); Shih-Cheng Hsueh, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 33 days.

(21) Appl. No.: 10/280,175

(22) Filed: Oct. 24, 2002

(65) Prior Publication Data

US 2003/0049872 A1 Mar. 13, 2003

Related U.S. Application Data

(60) Division of application No. 09/738,815, filed on Dec. 15, 2000, which is a continuation-in-part of application No. 09/513,885, filed on Feb. 25, 2000, now Pat. No. 6,305,095.

(51) Int. Cl.[7] ................................................ G01R 31/26
(52) U.S. Cl. ............................ 438/14; 438/17; 438/18
(58) Field of Search ................................ 438/275, 401, 438/17, 289, 18, 14, 462, 975, 15, 11, 260; 257/797, 48, 536; 338/118, 150; 33/645; 324/512

(56) References Cited

U.S. PATENT DOCUMENTS

| | | | |
|---|---|---|---|
| 3,808,527 A | 4/1974 | Thomas | |
| 4,384,349 A | 5/1983 | McElroy | |
| 4,386,459 A | 6/1983 | Boulin | |
| 4,437,760 A | * 3/1984 | Ausschnitt | ................... 355/133 |
| 4,571,538 A | 2/1986 | Chow | |
| 4,647,850 A | 3/1987 | Henderson et al. | |
| 5,093,702 A | * 3/1992 | Kim | ............................ 257/296 |
| 5,456,018 A | 10/1995 | Irlbeck et al. | |
| 5,457,650 A | 10/1995 | Sugiura et al. | |
| 5,526,282 A | * 6/1996 | Nower et al. | ................ 700/279 |
| 5,543,633 A | 8/1996 | Losavio et al. | |
| 5,617,340 A | * 4/1997 | Cresswell et al. | ............. 702/85 |
| 5,691,216 A | * 11/1997 | Yen et al. | ..................... 438/275 |
| 5,699,282 A | 12/1997 | Allen et al. | |
| 5,700,732 A | * 12/1997 | Jost et al. | ..................... 438/401 |
| 5,770,995 A | * 6/1998 | Kamiya | ....................... 338/118 |
| 5,811,858 A | * 9/1998 | Ohkubo | ........................ 257/369 |
| 5,925,937 A | * 7/1999 | Jost et al. | .................... 257/797 |
| 5,998,226 A | 12/1999 | Chan | |
| 6,020,227 A | * 2/2000 | Bulucea | ........................ 438/194 |

(List continued on next page.)

Primary Examiner—Carl Whitehead, Jr.
Assistant Examiner—Laura M Schillinger
(74) Attorney, Agent, or Firm—Jeanette S. Harms; Edel M. Young

(57) ABSTRACT

An electrical alignment test structure enables monitoring and measuring misalignment between layers (or associated masks) of an IC. The alignment test structure comprises a target region and an alignment feature in different layers. The target region and the alignment feature may be formed in diffusion and polysilicon layers, respectively or in well and diffusion layers, respectively. In both embodiments, the alignment feature controls the size of a conductive channel in the target region. Misalignment can be checked by comparing channel resistance with a baseline (no misalignment) resistance. In another embodiment, the target region and alignment feature are formed in the diffusion and polysilicon layers, respectively, wherein the alignment feature controls the relative widths of the source and drain regions. Misalignment can be checked by comparing current flow with a baseline current. In another embodiment, the target and alignment regions are formed in the well and diffusion layers, respectively, to form a diode, wherein misalignment can be checked by comparing current flow through the alignment feature with a baseline current. Multiple test structures can be combined in an array in accordance with an embodiment of the invention. By configuring the test structures in two mirror-image sets, the array can measure the amount of misalignment between the well and diffusion layers.

14 Claims, 15 Drawing Sheets

U.S. PATENT DOCUMENTS

| | | | | |
|---|---|---|---|---|
| 6,107,108 A | * | 8/2000 | Chen et al. | 438/14 |
| 6,127,700 A | * | 10/2000 | Bulucea | 257/335 |
| 6,137,186 A | * | 10/2000 | Jost et al. | 257/797 |
| 6,242,757 B1 | * | 6/2001 | Tzeng et al. | 257/48 |
| 6,305,095 B1 | * | 10/2001 | Look et al. | 33/645 |
| 6,313,511 B1 | * | 11/2001 | Noguchi | 257/392 |
| 6,393,714 B1 | * | 5/2002 | Look et al. | 33/645 |
| 6,436,726 B2 | * | 8/2002 | Look et al. | 438/17 |
| 6,465,305 B1 | * | 10/2002 | Look et al. | 438/275 |
| 6,563,320 B1 | * | 5/2003 | Look et al. | 324/512 |
| 6,647,311 B1 | * | 11/2003 | Goff | 700/125 |

* cited by examiner

US 6,716,653 B2

MASK ALIGNMENT STRUCTURE FOR IC LAYERS

RELATED APPLICATIONS

This application is a divisional application of U.S. patent application Ser. No. 09/738,815 filed on Dec. 15, 2000 by Kevin T. Look and Shih-Cheng Hsueh, entitled "Mask-Alignment Structure for IC Layers"

which is a continuation in part of U.S. patent application Ser. No. 09/513,885 filed on Feb. 25, 2000 by Kevin T. Look and Shih-Cheng Hsueh, entitled "Methods and Circuits for Mask-Alignment Detection" which issued on Oct. 23, 2001 as U.S. Pat. No. 6,305,095 B1 all of which are incorporated herein by reference.

FIELD OF THE INVENTION

The present invention relates to a structure for measuring mask and layer alignment in semiconductor fabrication processes.

BACKGROUND OF THE INVENTION

Modern integrated circuits (ICs) are fabricated in multiple layers on a silicon wafer, each layer representing a 2-dimensional layout of device elements (e.g., gates, gate dielectrics, source/drain regions, etc.). Typically, photolithographic techniques are used to produce the patterns for each layer, with those patterns controlling the subsequent formation of the device elements in a particular layer. To ensure proper function of an IC, the multiple layers making up that IC must be precisely aligned, meaning that the associated masks used in the photolithographic process steps must be aligned. It is therefore important to be able to monitor and measure this mask or layer alignment.

A common method for mask alignment involves target markings on the masks and wafers. Through the use of high-magnification equipment or similar optical sensing techniques, misalignment can be visually measured and monitored. However, this manual technique is time-consuming and susceptible to human error. Consequently, such a technique is not feasible for gathering a large statistical base of information or monitoring a relatively large number of wafers.

To overcome the aforementioned limitations of manual measurement techniques, electrical test methods have been developed. Conventional electrical alignment test methods involve the creation of special multi-layer conductive elements using the same fabrication processes being used to produce the actual ICs. The multi-layer conductive elements are configured such that any misalignment between layers results in a change in the resistance of the conductive elements. By comparing the measured resistance with a baseline (i.e., no misalignment) resistance value, the total amount of misalignment between layers can be determined.

FIG. 1 shows an example of a conventional electrical alignment test structure 100, as described in U.S. Pat. No. 4,571,538, issued Feb. 18, 1986 to Chow. Test structure 100 comprises a plurality of u-shaped features 130, a plurality of rectangular features 120, a plurality of square features 110, and contact pads A, B, and C. The plurality of u-shaped features 130 are formed in a polysilicon layer. The pattern of square features 110 is formed in a contact layer. Finally, the pattern of rectangular features 120 and pads A, B, and C are formed in a metal layer.

To form test structure 100, the plurality of u-shaped features 130 are formed in the polysilicon layer during the same process steps used to form other polysilicon layer features in the IC. Next, the plurality of square features 110 are formed during a contact process step, and the plurality of rectangular features 120, and pads A, B, and C are formed during a metallization process step. A dielectric layer (not shown) isolates the plurality of u-shaped features 130 from the plurality of rectangular features 120. Therefore, the plurality of square features 110 provide the only electrical contact between the u-shaped features 130 and the rectangular features 120.

Test structure 100 enables measurement of any misalignment between the polysilicon layer (features 130) and the contact layer (features 110) in the Y-direction (as indicated by the axes in FIG. 1). If the contact layer and polysilicon layers are perfectly aligned, the electrical paths between pads A and C and pads B and C are substantially the same length, and therefore the resistances between pads A and C (Rac) and between pads B and C (Rbc) are substantially the same. However, if the contact layer is shifted in the positive Y-direction (upwards) with respect to the polysilicon layer, the electrical path between pads A and C becomes longer than the path between pads B and C, and therefore resistance Rac becomes greater than resistance Rbc. Likewise, if the contact layer is shifted in the negative Y-direction (downwards) with respect to the polysilicon layer, resistance Rac becomes less than resistance Rbc. In this manner, the Y-direction alignment of the polysilicon and contact layers (and masks) can be measured. A second test structure can be oriented perpendicular to test structure 100 to provide X-axis alignment measurement.

FIG. 2 shows another example of a conventional alignment test structure 200, as described in U.S. Pat. No. 4,386,459, issued Jun. 7, 1983 to Boulin. Test structure 200 comprises a serpentine conductive member 210, contact pads A-I, and contacts Ca—Ci. Conductive member 210 comprises contiguous linear elements 211–220 forming two interconnected S-shaped elements in a first layer, such as a metal, polysilicon, or diffusion layer. The first S-shaped element comprises horizontal elements 211, 213, and 215, and vertical elements 212 and 214. The second S-shaped element comprises vertical elements 216, 218, and 220, and horizontal elements 217 and 219. Contact pads A-I are formed in a second layer, such as a metal layer, that overlies an insulating layer (not shown) on the first layer. Contacts Ca—Ci are formed in a third layer between the first and second layers, providing electrical contact between contact pads A-I and conductive member 210.

Contact pads A-I are located along conductive member 210 such that when the first and second layers are properly aligned, the electrical path from pad B to pad C (Pbc) is the same length as the electrical path from pad C to pad D (Pcd), and the electrical path from pad F to pad G (Pfg) is the same length as the electrical path from pad G to pad H (Pgh). Under such circumstances, the resistances between pads B and C (Rbc) and pads C and D (Rcd) would be the same, as would the resistances between pads F and G (Rfg) and pads G and H (Rgh). Misalignment between the first and second layers would change the relative lengths of the electrical paths described above, thereby creating resistance differentials indicative of the misalignment. For example, if the second mask (contact pads A-I) is shifted in the positive Y-direction with respect to the first mask (conductive element 210), the length of electrical path Pfg is reduced, while the length of electrical path Pgh is increased. Consequently, resistance Rfg becomes smaller than resistance Rgh, and a positive Y-axis misalignment is indicated. Similarly, if the second mask is shifted in the positive X-direction with respect to the first mask, the lengths of electrical paths Pbc and Pcd are decreased and increased, respectively. Therefore, resistance Rbc becomes smaller than resistance Rcd, thereby indicating a positive X-axis misalignment.

FIG. 3a shows another example of a conventional alignment test structure 300, as described in U.S. Pat. No. 5,770,995, issued Jun. 23, 1998 to Kamiya. Test structure 300 comprises two conductive regions 310 in a first layer, four triangular openings 320 in a second layer formed over the first layer, and contact pads A and B and an interconnect 330 in a third layer formed over the second layer. The four triangular openings 320 are arranged linearly, with two triangular openings 320 being formed over one of the conductive regions 310, and the other two triangular openings 320 being formed over the other conductive region 310. Contact pad A extends over one of the outer triangular openings 320, while contact pad B extends over the other outer triangular opening 320, with interconnect 330 being formed over the two inner triangular openings 320.

As shown in cross-section S—S of FIG. 3b, contact pads A and B and interconnect 330 (third layer) are insulated from conductive regions 310 (first layer) by a dielectric layer 350 (second layer). However, electrical contact is made between the first and third layers where contact pads A and B and interconnect 330 extend through triangular openings 320 to meet conductive regions 310. A contact layer can be included under pads A and B and interconnect 330 to improve the electrical contact between the first and third layers.

Referring back to FIG. 3a, because all triangular openings 320 are oriented in the same direction, the contact area between pads A and B and interconnect 330 and conductive regions 310 varies with the relative positions of the first and third layers in the Y-direction (vertically). The resulting change in resistance between pads A and B can then be measured to detect misalignment between the first and third layers. For example, if the third layer is shifted in the positive Y-direction (upward) with respect to the first layer, the contact areas between contact pads A and B and interconnect 330 and conductive regions 310 are reduced, thereby increasing the resistance between pads A and B. Similarly, if the third layer is shifted in the negative Y-direction (downward) with respect to the first layer, the resistance between pads A and B is reduced due to the increased electrical contact area. A second test structure can be perpendicularly oriented with respect to test structure 300 to provide X-direction (horizontal) misalignment detection.

While the aforementioned electrical alignment test structures can be used to detect misalignment between electrically connected layers, modern ICs typically also require fine alignment between layers that do not make direct electrical contact. For example, the gate of a metal-oxide-semiconductor (MOS) transistor must be aligned with the diffusion region of the transistor, even though the two are separated by a dielectric layer. Accordingly, it is desirable to provide an electrical alignment test structure that enables measurement of alignment between layers that do not make direct electrical contact. It is also desirable to provide a simplified alignment test structure that does not require complex layout paths (FIGS. 1 and 2) or irregular angles (FIG. 3a), thereby substantially decreasing design complexity and manufacturing cost.

SUMMARY

The present invention provides an electrical alignment test structure for monitoring and measuring misalignment between layers (or associated masks) of an IC.

A polysilicon-diffusion test structure in accordance with an embodiment of the present invention comprises a target region, two contact pads coupled to the target region, and an alignment feature. The target region, contact pads, and alignment feature are in different layers of the IC, wherein the alignment feature is electrically isolated from the target region. According to an aspect of the present invention, the target region is formed in the diffusion layer of the IC and the alignment feature is formed in the polysilicon layer of the IC. The alignment feature is positioned over the target region and serves as a partial mask during doping of the target region. The position of the alignment feature with respect to the target region defines the size of a conductive channel in the target region for carrying current between the two contact pads. The measured pad to pad resistance can be compared to a baseline (no misalignment) resistance value to check for misalignment between the electrically isolated polysilicon and diffusion layers of the IC.

Multiple polysilicon-diffusion test structures can be combined in an array in accordance with an embodiment of the present invention. By properly configuring the test structures in two mirror-image sets, the array can measure the amount of misalignment between the polysilicon and diffusion layers. If each set is configured such that the nominal conductive channel width of each test structure is increased by a fixed amount over the previous test structure when moving away from the centerline, then characteristic current curves can be graphed for each set. If the polysilicon and diffusion layers are aligned, the characteristic curves of the two sets are the same. However, if the two layers are misaligned, one characteristic curve is shifted to the right, and the other to the left. The amount of misalignment can be determined by measuring the amount of shift for either curve or halving the distance between both shifted characteristic curves.

A well-diffusion test structure in accordance with another embodiment of the present invention comprises a target region, two contact pads coupled to the target region, and an alignment feature. The target region, contact pads, and alignment feature are in different layers of the IC. According to an aspect of the present invention, the target region is formed in the well layer of the IC and the alignment feature is formed in the diffusion layer of the IC. The alignment feature is formed over a portion of the target region, and a much thicker field oxide is formed over the rest of the test structure. The portions of the field oxide over the target region consume much more of the silicon substrate than the thin gate oxide (alignment structure), thereby reducing the conduction area of the target region. Therefore, the position of the alignment structure with respect to the target region defines the size of the conductive channel between the contact pads. The measured pad to pad resistance of the test structure can be compared to a baseline (no misalignment) resistance value to check for misalignment between the well and diffusion layers of the IC.

Multiple well-diffusion test structures can be combined in an array in accordance with another embodiment of the present invention. By properly configuring the test structures in two mirror image sets, the array can measure the amount of misalignment between the well and diffusion layers. If each set is configured such that the nominal conductive channel cross sectional area is decreased by a fixed increment over the previous test structure when moving away from the centerline, then characteristic resistance curves can be graphed for each set. If the well and diffusion layers are aligned, the characteristic curves of the two sets are the same. However, if the two layers are misaligned, one characteristic curve is shifted to the right, and the other to the left. The amount of misalignment can be determined by measuring the amount of shift for either curve or halving the distance between both shifted characteristic curves.

Another polysilicon-diffusion test structure in accordance with another embodiment of the present invention comprises a target region and an alignment feature. According to an aspect of the present invention, the target region is formed in the diffusion layer of the IC and the alignment feature is formed in the polysilicon layer of the IC. The alignment feature is formed over a central portion of the target region, after which the target region is doped. The alignment feature serves as a mask for the target region during doping, thereby forming the source and drain regions in the diffusion layer. The relative positions of the polysilicon and diffusion layers therefore determine the relative sizes of the source and drain regions of the test structure. The measured current flow of the test structure can be compared to a baseline (no misalignment) current value to check for misalignment between the electrically isolated polysilicon and diffusion layers of the IC. The sensitivity of the test structure current flow to misalignment can be enhanced by modifying the outlines of the drain and source regions.

Multiple polysilicon-diffusion test structures can be combined in an array in accordance with another embodiment of the present invention. By properly configuring the test structures in two mirror image sets, the array can measure the amount of misalignment between the polysilicon and diffusion layers. If each set is configured such that the nominal distance between the alignment feature and an edge of the drain region is increased by a fixed increment over the previous test structure when moving away from the centerline, then characteristic current curves can be graphed for each set. If the polysilicon and diffusion layers are aligned, the characteristic curves of the two sets are the same. However, if the two layers are misaligned, one characteristic curve is shifted to the right, and the other to the left. The amount of misalignment can be determined by measuring the amount of shift for either curve or halving the distance between both shifted characteristic curves.

A well-diffusion test structure in accordance with another embodiment of the present invention comprises a target region and an alignment region. The target region is formed in a well layer of an IC, while the alignment region is formed in a diffusion layer of the IC. The alignment region is formed within the target region, and is doped using the opposite dopant type from the target region. The alignment region and target region form a diode at their PN junction. When the diode is reverse biased, only a small leakage current flows through the alignment region. However, if the alignment region is close to the edge of the target region, the depletion layer under the alignment region can interact with the substrate outside the target region. Additional current can then flow directly from the alignment region to the substrate. The closer the alignment region is formed to the edge of the target region, the larger the total current flow through the alignment region.

The relative positions of the diffusion and well layers therefore define the amount of current flow through the test structure. A measured current can then be compared to a baseline (no misalignment) current value to check for misalignment between the well and diffusion layers of the IC. The test structure includes only basic shapes and therefore provides a simple means for measuring misalignment.

Multiple well-diffusion test structures can be combined in an array in accordance with another embodiment of the present invention. By properly configuring the test structures in two mirror image sets, the array can measure the amount of misalignment between the well and diffusion layers. If each set is configured such that the nominal distance between the alignment region and an edge of the target region is increased by a fixed increment over the previous test structure when moving away from the centerline, then characteristic leakage current curves can be graphed for each set. If the well and diffusion layers are aligned, the characteristic curves of the two sets are the same. However, if the two layers are misaligned, one characteristic curve is shifted to the right, and the other to the left. The amount of misalignment can be determined by measuring the amount of shift for either curve or halving the distance between both shifted characteristic curves.

The present invention will be more fully understood in view of the following description and drawings.

DETAILED DESCRIPTION

Figure 1:
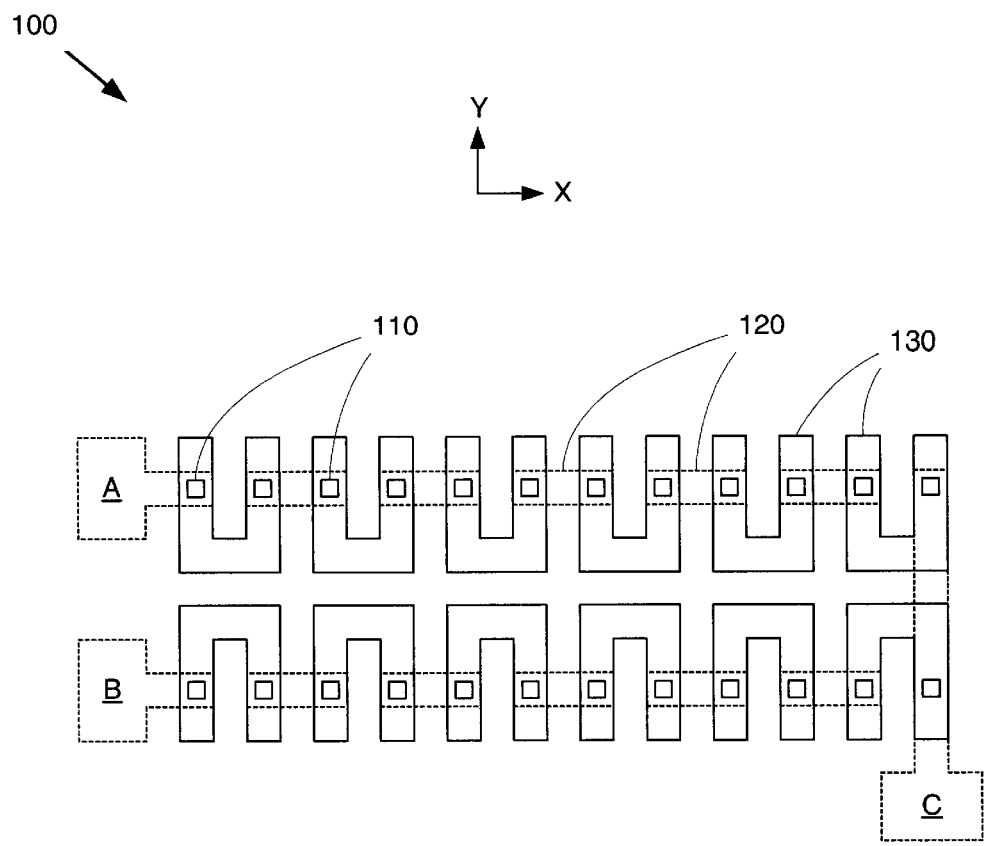
FIG. 1 is a diagram of a conventional electrical alignment test structure.
Figure 2:
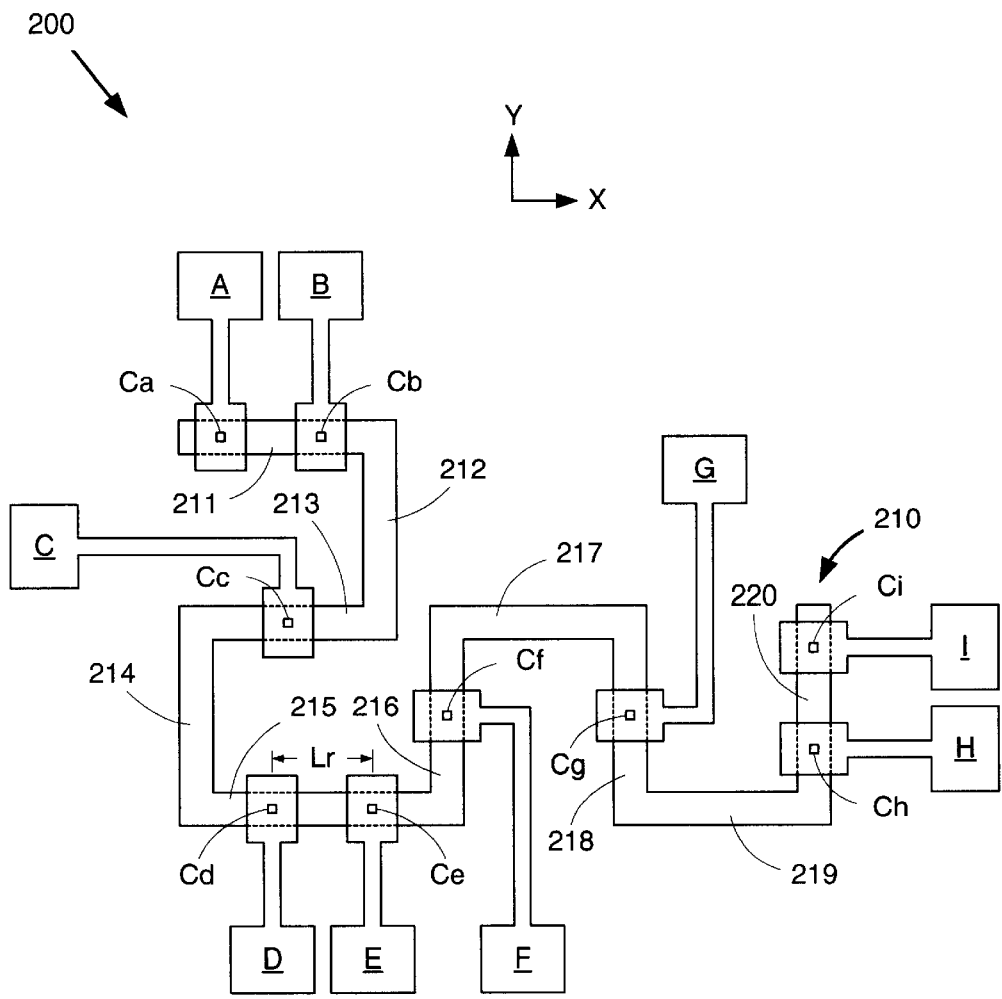
FIG. 2 is a diagram of another conventional electrical alignment test structure.
Figure 3A:
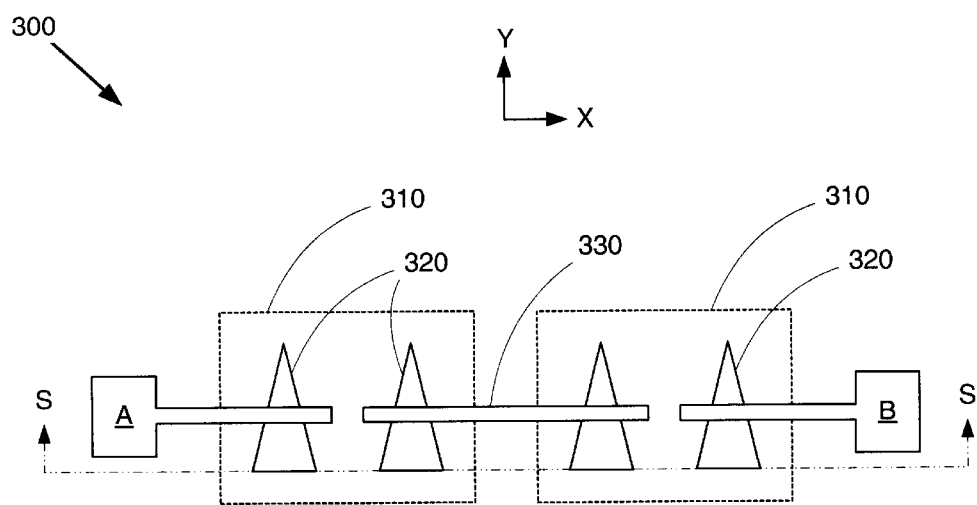
FIGS. 3a and 3b are diagrams of another conventional electrical alignment test structure.
Figure 3B:
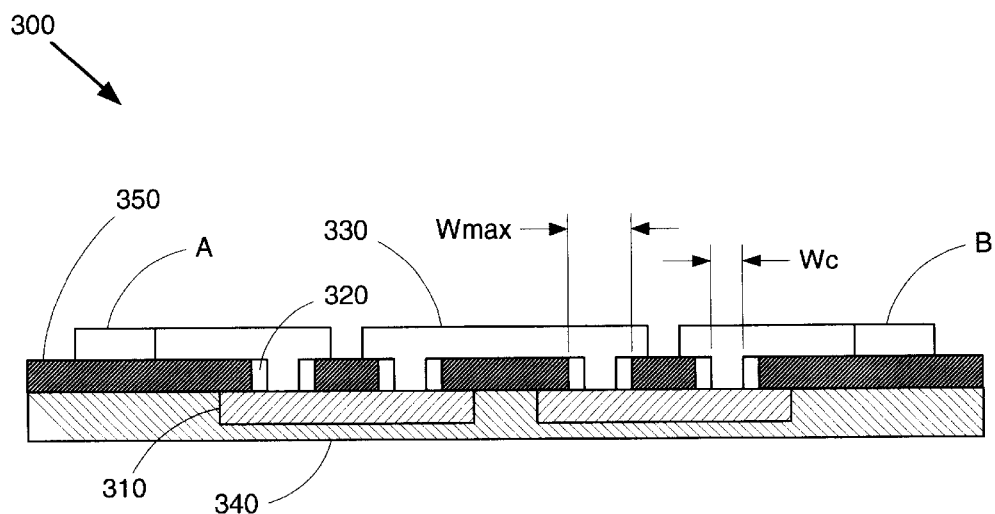
Figure 4A:
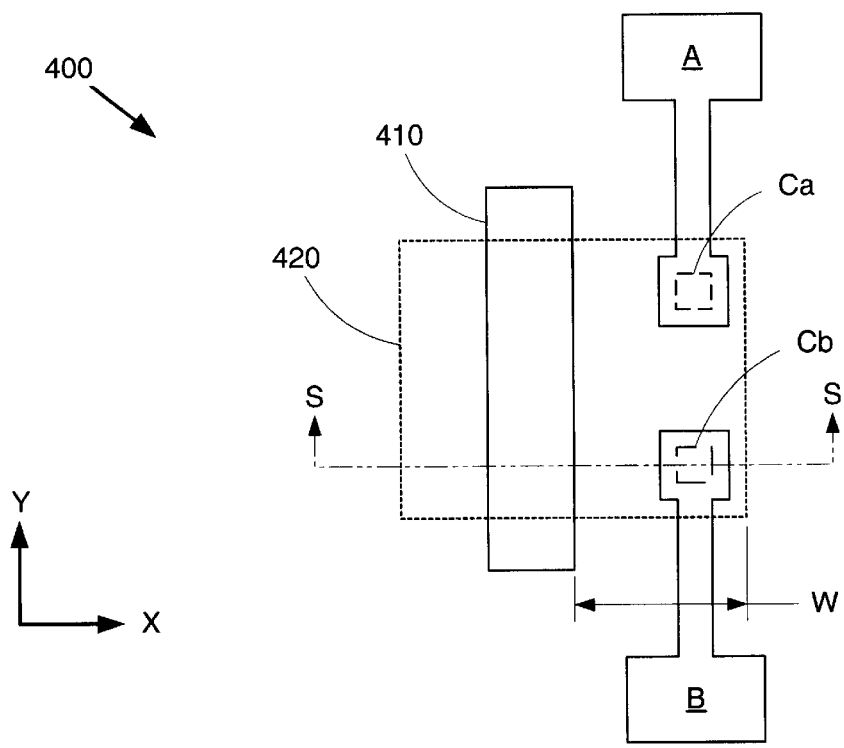
FIGS. 4a and 4b are diagrams of an electrical alignment test structure in accordance with an embodiment of the present invention.

FIG. 4a shows an electrical alignment test structure 400 for measuring layer (or mask) alignment in an IC in accordance with an embodiment of the present invention. Test structure 400 comprises a target region 420 in a first layer, contacts Ca and Cb in a second layer, contact pads A and B in a third layer, and an alignment feature 410 in a fourth layer. Note that descriptors such as "first" and "second" when used in conjunction with various IC layers do not necessarily indicate stacking order or formation order, but merely serve as differentiating designators.

Figure 4B:
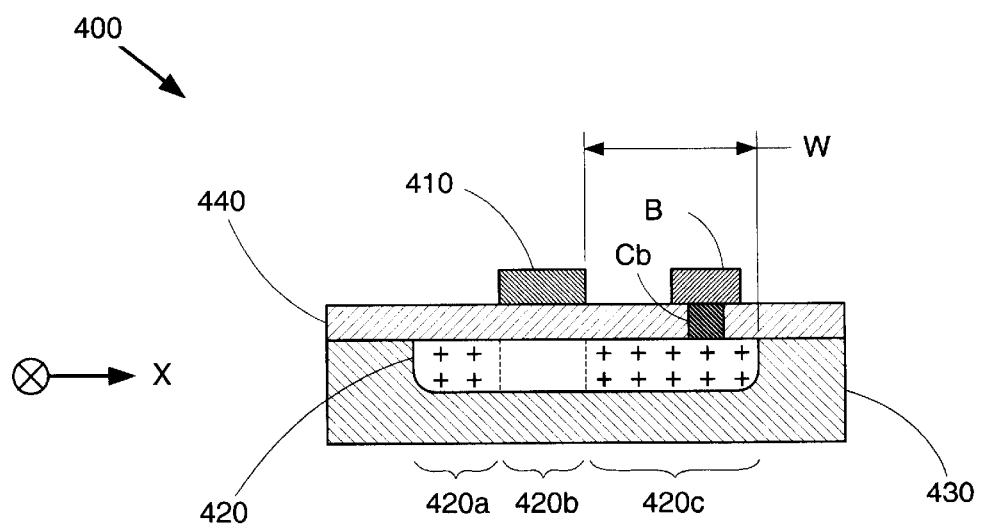

FIG. 4b shows a cross section S—S of test structure 400 according to an embodiment of the present invention. Target region 420 represents a defined area in a wafer 430 that is doped using a diffusion or ion implant process. A dielectric layer 440 isolates alignment feature 410 from target region 420. Dielectric layer 440 also separates the third layer from target region 420, with contact Cb providing an electrical path between pad B and target region 420. Similarly, although not shown in FIG. 4b, contact Ca provides an electrical path between pad A and target region 420.

According to an embodiment of the present invention, alignment feature 410 is formed during the process steps used to form a polysilicon layer (i.e., the fourth layer) of the IC. Target region 420 (i.e., the first layer) is then doped during a subsequent implant or diffusion process step. The first layer is often designated the "diffusion layer", even though an implant process may be used for the actual doping. A P-type dopant is indicated in FIG. 4b, although an N-type dopant could just as well be used. Where alignment feature 410 overlies target region 420, no doping of target region 420 takes place. Therefore, target region 420 ultimately comprises an undoped region 420b under alignment feature 410, and conductive channels (doped regions) 420a and 420c on either side of undoped region 420b. Test structure 400 is therefore particularly well suited for use with processes such as salicide, wherein source/drain diffusion regions are formed around polysilicon gate structures.

Because there are no free charge carriers in undoped region 420b, conductive channels 420a and 420c are electrically isolated from one another. Therefore, since contacts Ca and Cb are formed on conductive channel 420c, only conductive channel 420c provides a current path between pads A and B.

Contacts Ca and Cb and pads A and B are formed during the process steps used to form a contact layer (i.e., the second layer) and a metal layer (i.e., the third layer), respectively, of the IC. The actual creation of the contact and metal layers typically takes place during a single metallization process step. However, the two layers can be distinguished as separate layers, use separate masks, and have distinct lithography process steps.

Therefore, as shown in FIGS. 4a and 4b, conductive channel 420c provides an electrical path between pads A and B. The resistance of conductive channel 420c, and therefore the resistance between pads A and B, is inversely related to the width w of conductive channel 420c, i.e., the resistance of conductive channel 420c decreases as its width W increases. Width W is in turn determined by the position of alignment feature 410 with respect to target region 420. Thus, the alignment of the electrically isolated first (diffusion) and fourth (polysilicon) layers can be determined by measuring the resistance between pads A and B. For example, if alignment feature 410 is shifted in the positive X-direction (rightward in FIG. 4b) with respect to target region 420, the width W of conductive channel 420c is decreased, thereby increasing the resistance between pads A and B. By comparing the measured resistance between pads A and B with a baseline (no misalignment) resistance, the direction of misalignment can be determined. A second test structure similar to test structure 400 can be oriented perpendicularly to test structure 400 to provide Y-axis alignment measurement capability.

Figure 5:
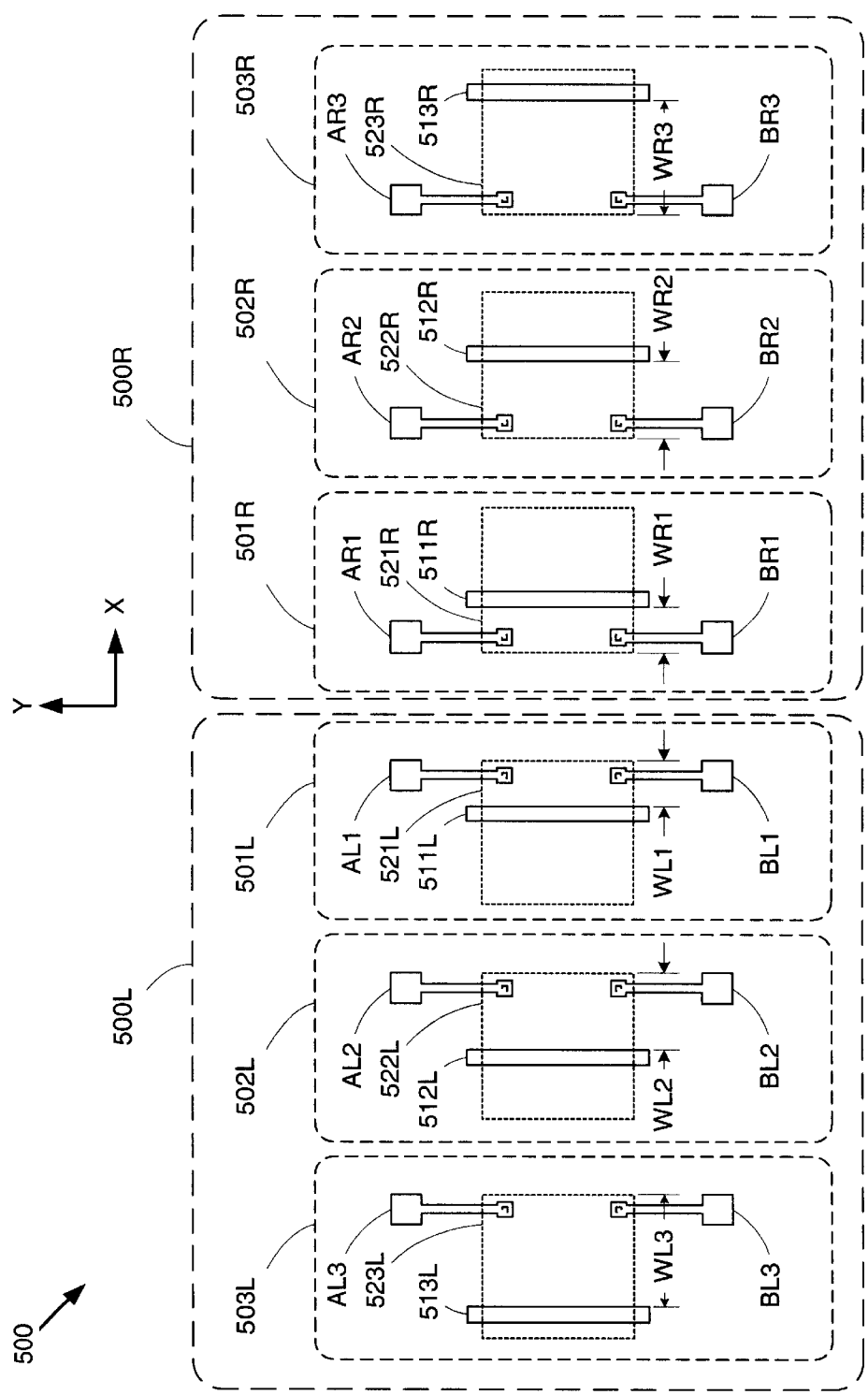
FIG. 5 is a diagram of an electrical alignment test array in accordance with an embodiment of the present invention.

FIG. 5 shows an alignment test structure array 500 in accordance with another embodiment of the present invention. Array 500 comprises a left half 500L comprising test structures 501L–503L, and a right half 500R comprising test structures 501R–503R. Each of test structures 501L–503L and 501R–503R is substantially similar to test structure 400 shown in FIG. 4a. Test structure 501L comprises a target region 521L formed in a diffusion layer, an alignment feature 511L formed in a polysilicon layer and positioned over, and a width WL1 from the right side of, target region 521L, and pads AL1 and BL1 formed in a metal layer and coupled to a conductive channel (not shown) of width WL1 in target region 521L. Test structure 502L comprises a target region 522L formed in the diffusion layer, an alignment feature 512L formed in the polysilicon layer and positioned over, and a width WL2 from the right side of, target region 522L, and pads AL2 and BL2 formed in the metal layer and coupled to a conductive channel (not shown) of width WL2 in target region 522L. Test structure 503L comprises a target region 523L formed in the diffusion layer, an alignment feature 513L formed in the polysilicon layer and positioned over, and a width WL3 from the right side of, target region 523L, and pads AL3 and BL3 formed in the metal layer and coupled to a conductive channel (not shown) of width WL3 in target region 523L. Test structure 501R comprises a target region 521R formed in the diffusion layer, an alignment feature 511R formed in the polysilicon layer and positioned over, and a width WR1 from the left side of, target region 521R, and pads AR1 and BR1 formed in the metal layer and coupled to a conductive channel (not shown) of width WR1 in target region 521R. Test structure 502R comprises a target region 522R formed in the diffusion layer, an alignment feature 512R formed in the polysilicon layer and positioned over, and a width WR2 from the left side of, target region 522R, and pads AR2 and BR2 formed in the metal layer and coupled to a conductive channel (not shown) of width WR2 in target region 522R. Test structure 503R comprises a target region 523R formed in the diffusion layer, an alignment feature 513R formed in the polysilicon layer and positioned over, and a width WR3 from the left side of, target region 523R, and pads AR3 and BR3 formed in the metal layer and coupled to a conductive channel (not shown) of width WR3 in target region 523R.

Test structures 501L–503L are configured such that width WL3 is greater than width WL2 by a specific increment d, and width WL2 is greater than width WL1 by the same specific increment d. Similarly, test structures 501R–503R are configured such that width WR3 is greater than width WR2, and width WR2 is greater than width WR1, by that same specific increment d. Furthermore, test structures 501L–503L and 501R–503R are configured such that when the polysilicon and diffusion layers align, widths WL1 and WR1 are equal, widths WL2 and WR2 are equal, and widths WL3 and WR3 are equal. Left half 500L and right half 500R of array 500 therefore form mirror images of one another.

Each of test structures 501L–503L and 501R–503R is formed and operated in the same manner as test structure 400 (FIGS. 4a and 4b) to indicate X-direction (horizontal) misalignment between the polysilicon and diffusion layers. An array similar to array 500 can be oriented perpendicularly to array 500 to provide Y-direction (vertical) misalignment detection capability. However, because array 500 includes a series of test structures rather than a single structure, array 500 enables the determination of the actual magnitude of misalignment between the two layers. Alignment features 511L–513L and 511R–513R are formed using the same mask, and therefore can be accurately positioned with respect to one another. Target regions 521L–523L and 521R–523R are also formed using a single mask, and can therefore attain a similar relative positional accuracy. Consequently, any misalignment between the polysilicon and diffusion layers adjusts each of widths WL1–WL3 and WR1–WR3 by the same amount. This uniform offset provides means for determining the misalignment between the polysilicon and diffusion layers.

Figure 6:
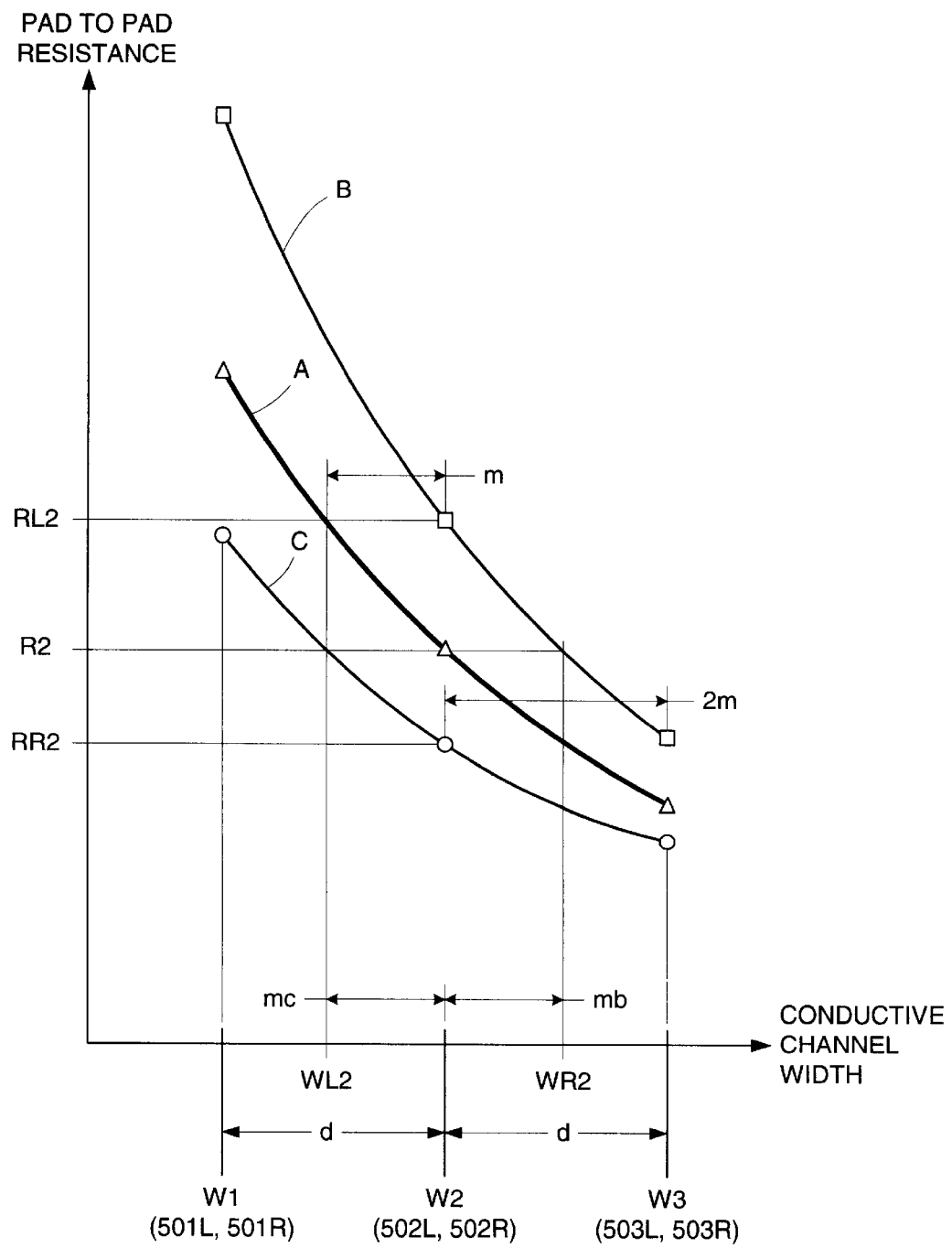
FIG. 6 is a graph of sample characteristic resistance curves for the electrical alignment test array of FIG. 5.

FIG. 6 shows a graph of characteristic resistance curves for left half 500L and right half 500R of array 500 shown in FIG. 5. The characteristic curves plot the pad to pad resistance versus conductive channel width for the test structures in the left and right halves of array 500. Because the two halves are mirror images of each other, corresponding test structures share the same horizontal axis points (i.e., test structures 501L and 501R share a single horizontal axis point, as do test structures 502L and 502R, and test structures 503L and 503R). When there is no misalignment, widths WL1 and WR1 are equal to a nominal width W1, and thus the pad to pad resistances of test structures 501L and 501R are equal. Similarly, widths WL2 and WR2, which are greater than widths WL1 and WR1, respectively, by an increment d, are both equal to a nominal width W2, and thus the pad to pad resistances of test structures 502L and 502R are equal. Finally, widths WL3 and WR3, which are greater than widths WL2 and WR2, respectively, by an increment d, are equal to a nominal width W3, and thus the pad to pad resistances of test structures 503L and 503R are equal. Therefore, when the polysilicon and diffusion layers are aligned, left half 500L and right half 500R share the same baseline characteristic curve A.

However, if the polysilicon and diffusion layers are misaligned, all the widths in left half 500L are shifted by a misalignment increment m in one direction, and all the widths in right half 500R are shifted by increment m in the opposite direction. For example, if the polysilicon layer in FIG. 5 is shifted by an increment m in the positive X-direction (rightward) with respect to the diffusion layer, each of widths WL1–WL3 would be decreased by increment m while each of widths WR1–WR3 would be increased by increment m. The decrease in widths WL1–WL3 would cause a corresponding increase in the pad to pad resistances of test structures 501L–503L, respectively, thereby resulting in curve B of FIG. 6. At the same time, the increase in widths WR1–WR3 would cause a corresponding decrease in the pad to pad resistances of test structures 501R–503R, respectively, thereby resulting in curve C of FIG. 6.

Once created, curves B and C can be used to determine the amount of misalignment between the polysilicon and diffusion layers. For example, as shown by curve B, test structure 502L does not provide the nominal pad to pad resistance of R2, but rather provides a raised resistance RL2, thereby indicating that the actual width WL2 of test structure 502L is not equal to the nominal width W2. Actual width WL2 can be determined by finding the intersection of measured resistance RL2 and baseline curve A. The value of the misalignment between the polysilicon and diffusion layers can then be calculated by finding the difference between nominal width W2 and actual width WL2, indicated as increment mc in FIG. 6. Similarly, as shown by curve C, test structure 502R does not provide the nominal pad to pad resistance of R2, but rather provides a lowered resistance RR2, thereby indicating that the actual width WR2 of test structure 502R is not equal to the nominal width W2. Actual width WR2 can be determined by finding the intersection of measured resistance RR2 and baseline curve A. The value of the misalignment between the polysilicon and diffusion layers can then be calculated by finding the difference between nominal width W2 and actual width WR2, indicated as increment mb in FIG. 6.

Because widths WL1–WL3 and widths WR1–WR3 are all adjusted by the same increment m, curves B and C have the same constant offsets from curve A, i.e., the horizontal distances between curves A and B (increment mb) and curves A and C (increment mc) are both equal to increment m. Consequently, the magnitude of the misalignment (increment m) between the polysilicon and diffusion layers can be calculated using either curve B or curve C. Alternatively, increment m can be calculated by halving the horizontal distance between curves B and C, i.e., because the horizontal distance between curves A and B is equal to increment m, and the horizontal distance between curves A and C is equal to increment m, the horizontal distance between curves B and C must be equal to twice increment m.

Various curve-fitting algorithms can be used to create characteristic curves B and C from the measured data points. Logically, the more data points (i.e., test structures) used to generate curves B and C, the more accurately the horizontal offset of the curves can be determined, and therefore the more accurately the layer to layer misalignment can be calculated. With a relatively large number of data points, reasonably accurate curves can be generated without using any curve-fitting by simply connecting the data points with straight lines.

Figure 7A:
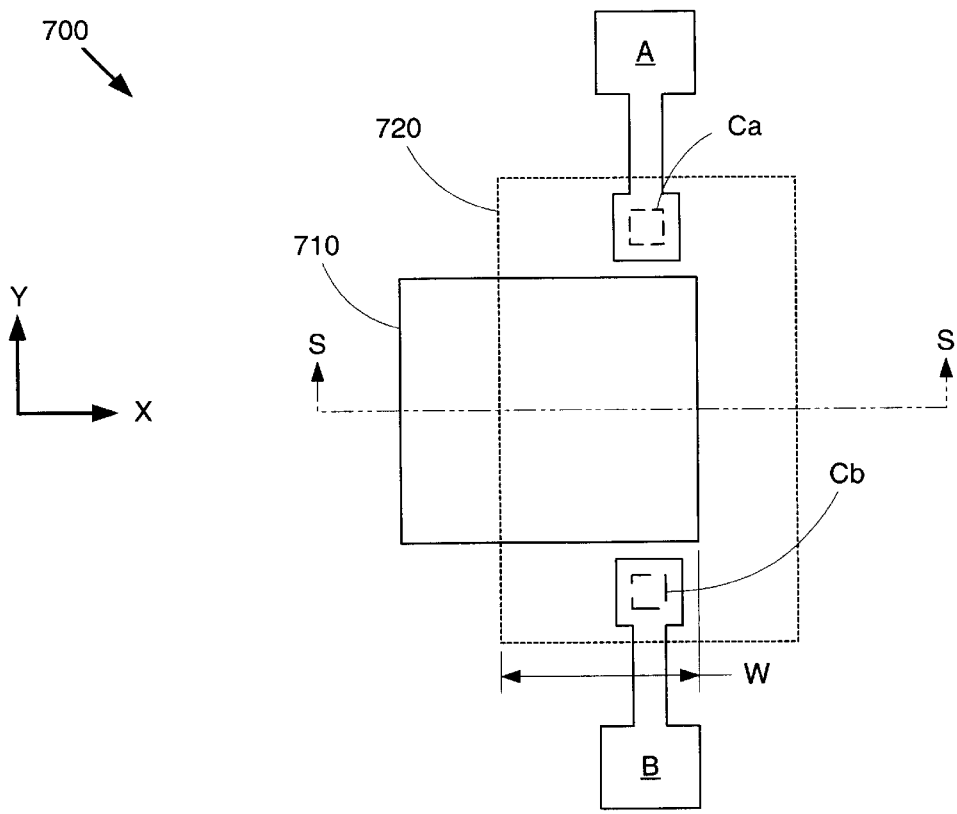
FIGS. 7a and 7b are diagrams of an electrical alignment test structure in accordance with another embodiment of the present invention.

FIG. 7a shows an electrical alignment test structure 700 for measuring layer (or mask) misalignment in an IC in accordance with another embodiment of the present invention. Test structure 700 comprises a target region 720 in a first layer, contacts Ca and Cb in a second layer, contact pads A and B in a third layer, and an alignment feature 710 in a fourth layer. Note that descriptors such as "first" and "second" when used in conjunction with various IC layers do not necessarily indicate stacking order or formation order, but merely serve as differentiating designators.

Figure 7B:
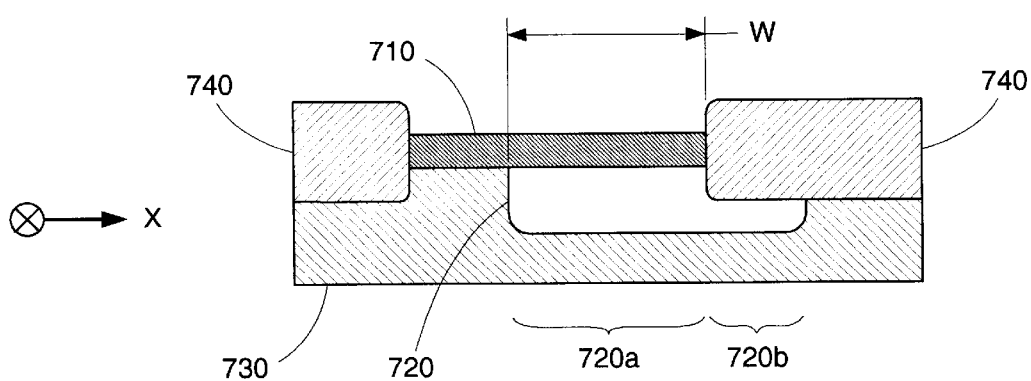

FIG. 7b shows a cross section S—S of test structure 700 according to an aspect of the present invention. Target region 720 represents a defined area in a wafer 730 that is doped using a diffusion or ion implant process. Alignment feature 710 overlies a portion of target region 720, indicated by an overlap width W. Areas of test structure 700 not covered by alignment feature 710 are covered by a field oxide 740. Contact pads A and B (not shown in FIG. 7b) are formed on field oxide 740. Contacts Ca and Cb are formed on a well tap through field oxide 740, providing electrical contact between target region 720 and pads A and B, respectively.

According to an aspect of the present invention, target region 720 (i.e., the first layer) is formed in wafer 730 during the diffusion or implant process steps used to form a well layer of the IC. Alignment feature 710 is formed during the process steps used to form a diffusion layer (i.e., the fourth layer) of the IC. Alternatively, alignment feature 710 could be formed during the process steps used to form a gate oxide layer of the IC. After formation of field oxide 740, contacts Ca and Cb and pads A and B are formed during the process steps used to form a contact layer (i.e., the second layer) and a metal layer (i.e., the third layer), respectively, of the IC. The actual creation of the contact and metal layers typically takes place during a single metallization process step. However, the two layers can be distinguished as separate layers, use separate masks, and have distinct lithography process steps.

As shown in FIG. 7b, field oxide 740 is typically much thicker than a diffusion layer (e.g., alignment feature 710).

Formation of a thicker oxide "consumes" more of the underlying silicon substrate (i.e., wafer 730, including target region 720). In a reduced-depth region 720b of target region 720, the growth of field oxide 740 into wafer 730 significantly reduces the cross-sectional area of target region 720, as compared to a diffusion region 720a. Thus, the greater the misalignment between the well and diffusion layers (i.e., the smaller width W becomes), the greater the resistance between contact pads A and B. Alignment test structure 700 is therefore particularly well suited for use in conjunction with advanced MOS processes, where diffusion-well alignment is critical. By comparing the measured resistance between pads A and B with a baseline (no misalignment) resistance, the direction of misalignment can be determined.

Figure 8:
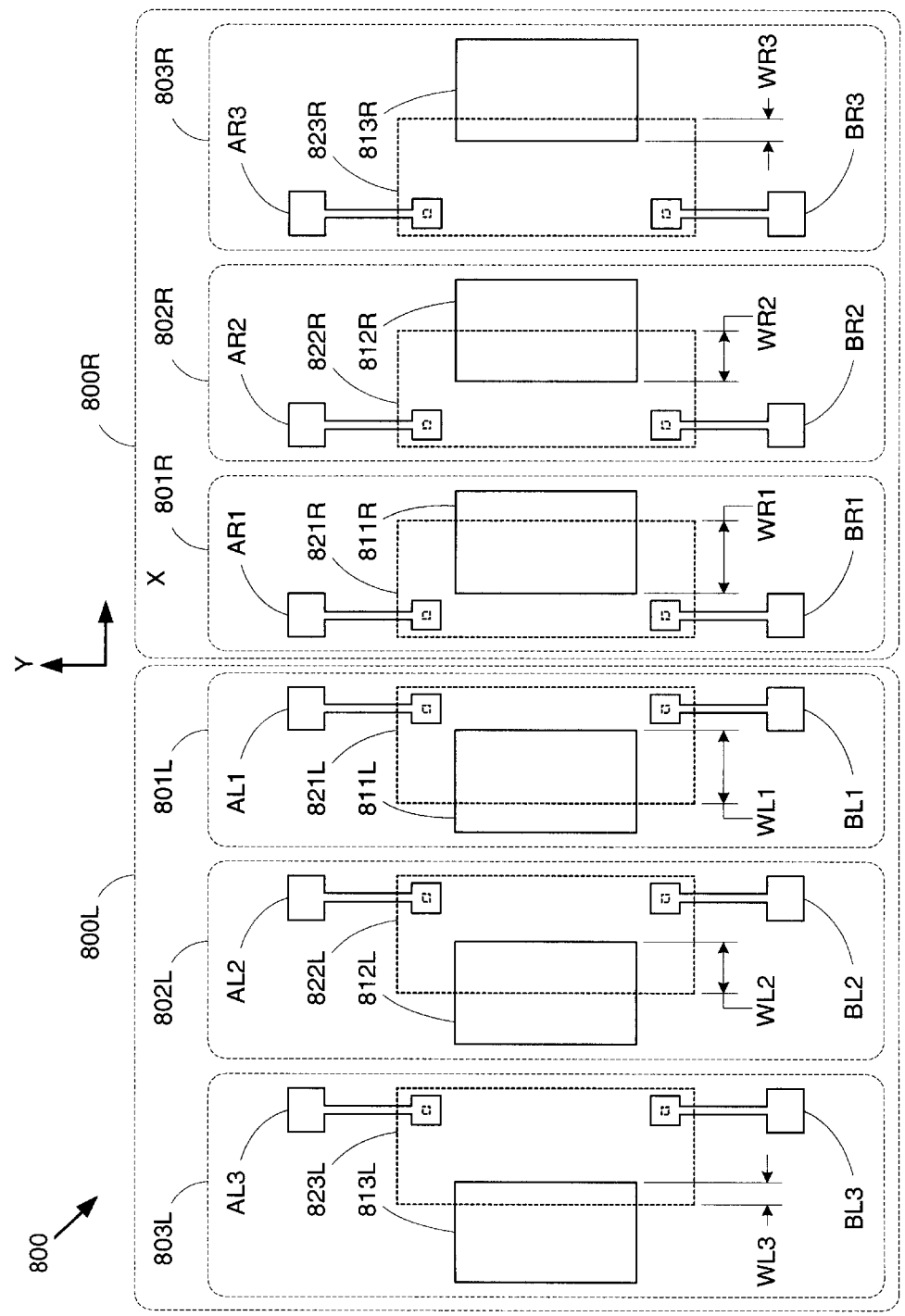
FIG. 8 is a diagram of an electrical alignment test array in accordance with another embodiment of the present invention.

FIG. 8 shows an alignment test structure array 800 in accordance with another embodiment of the present invention. Array 800 comprises a left half 800L comprising test structures 801L–803L, and a right half 800R comprising test structures 801R–803R. Each of test structures 801L–803L and 801R–803R is substantially similar to test structure 700 shown in FIG. 4a. While three test structures have been shown in each half of array 800, it is understood that any number of test structures could be included in array 800.

Test structure 801L comprises a target region 821L formed in a well layer, an alignment feature 811L formed in a diffusion layer and extending a width WL1 over the left portion of target region 821L, and pads AL1 and BL1 formed in a metal layer and coupled to target region 821L. Test structure 802L comprises a target region 822L formed in the well layer, an alignment feature 812L formed in the diffusion layer and extending a width WL2 over the left portion of target region 822L, and pads AL2 and BL2 formed in the metal layer and coupled to target region 822L. Test structure 803L comprises a target region 823L formed in the well layer, an alignment feature 813L formed in the diffusion layer and extending a width WL3 over the left portion of target region 823L, and pads AL3 and BL3 formed in the metal layer and coupled to target region 823L. Test structure 801R comprises a target region 821R formed in the well layer, an alignment feature 811R formed in the diffusion layer and extending a width WR1 over the right portion of target region 821R, and pads AR1 and BR1 formed in the metal layer and coupled to target region 821R. Test structure 802R comprises a target region 822R formed in the well layer, an alignment feature 812R formed in the diffusion layer and extending a width WR2 over the right portion of target region 822R, and pads AR2 and BR2 formed in the metal layer and coupled to target region 822R. Test structure 803R comprises a target region 823R formed in the well layer, an alignment feature 813R formed in the diffusion layer and extending a width WR3 over the right portion of target region 823R, and pads AR3 and BR3 formed in the metal layer and coupled to target region 823R. Areas of target regions 821R–823R and 821L–823L not covered by alignment feature 810 are covered by a thick field oxide layer (not shown for clarity).

Test structures 801L–803L are configured such that width WL1 is greater than width WL2 by a specific increment d, and width WL2 is greater than width WL3 by the same specific increment d. Similarly, test structures 801R–803R are configured such that width WR1 is greater than width WR2, and width WR2 is greater than width WR3, by that same specific increment d. Furthermore, test structures 801L–803L and 801R–803R are configured such that when the well and diffusion layers align, widths WL1 and WR1 are equal, widths WL2 and WR2 are equal, and widths WL3 and WR3 are equal. Left half 800L and right half 800R of array 800 therefore form mirror images of one another.

Each of test structures 801L–803L and 801R–803R is formed and operated in the same manner as test structure 700 (FIGS. 7a and 7b) to indicate X-direction (horizontal) misalignment between the well layer and the diffusion layer. An array similar to array 800 can be oriented perpendicularly to array 800 to provide Y-direction (vertical) misalignment detection capability. However, because array 800 includes a series of test structures rather than a single structure, array 800 enables the determination of the actual magnitude of misalignment between the two layers. Alignment features 811L–813L and 811R–813R are formed using the same mask, and therefore can be accurately positioned with respect to one another. Target regions 811L–813L and 811R–813R are also formed using a single mask, and can therefore attain a similar relative positional accuracy. Consequently, any misalignment between the well and diffusion layers adjusts each of widths WL1–WL3 and WR1–WR3 by the same amount. This uniform offset provides means for determining the misalignment between the well and diffusion layers.

Figure 9:
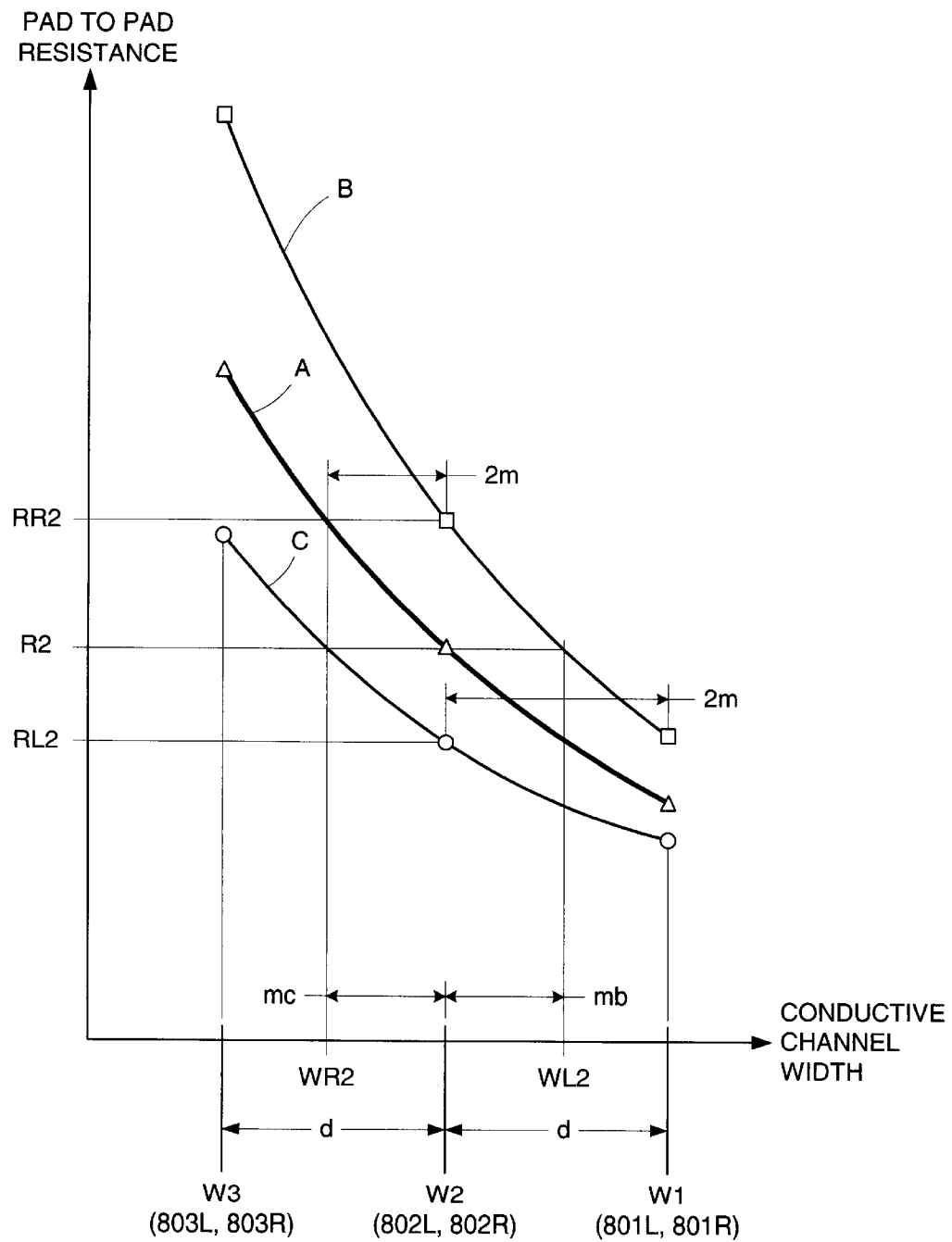
FIG. 9 is a graph of sample characteristic resistance curves for the electrical alignment test array of FIG. 8.

FIG. 9 shows a graph of characteristic resistance curves for left half 800L and right half 800R of array 800 shown in FIG. 8. The characteristic curves plot the pad to pad resistance versus diffusion overlap (of the target region) for the test structures in the left and right halves of array 800. Because the two halves are mirror images of each other, corresponding test structures share the same horizontal axis points (i.e., test structures 801L and 801R share a single horizontal axis point, as do test structures 802L and 802R, and test structures 803L and 803R). When there is no misalignment, overlap widths WL1 and WR1 are equal to a nominal width W1, and thus the pad to pad resistances of test structures 801L and 801R are equal. Similarly, widths WL2 and WR2, which are smaller than widths WL1 and WR1, respectively, by an increment d, are both equal to a nominal width W2, and thus the pad to pad resistances of test structures 802L and 802R are equal. Finally, widths WL3 and WR3, which are smaller than widths WL2 and WR2, respectively, by an increment d, are equal to a nominal width W3, and thus the pad to pad resistances of test structures 803L and 803R are equal. Therefore, when the gate oxide and diffusion layers are aligned, left half 800L and right half 800R share the same baseline characteristic curve A.

However, if the diffusion and well layers are misaligned, all the widths in left half 800L are shifted by a misalignment increment m in one direction, and all the widths in right half 800R are shifted by increment m in the opposite direction. For example, if the diffusion layer in FIG. 8 is shifted by an increment m in the positive X-direction (rightward) with respect to the well layer, each of widths WL1–WL3 would be increased by increment m while each of widths WR1–WR3 would be decreased by increment m. The increase in widths WL1–WL3 would cause a corresponding decrease in the pad to pad resistances of test structures 801L–803L, respectively, thereby resulting in curve C of FIG. 9. At the same time, the decrease in widths WR1–WR3 would cause a corresponding increase in the pad to pad resistances of test structures 801R–803R, respectively, thereby resulting in curve B of FIG. 9.

Once created, curves B and C can be used to determine the amount of misalignment between the diffusion and well layers. For example, as shown by curve C, test structure 802L does not provide the nominal pad to pad resistance of R2, but rather provides a lowered resistance RL2, thereby indicating that the actual width WL2 of test structure 802L is not equal to the nominal width W2. Actual width WL2 can be determined by finding the intersection of measured resistance RL2 and baseline curve A. The value of the misalignment between the diffusion and well layers can then be calculated by finding the difference between nominal width W2 and actual width WL2, indicated as increment mb in FIG. 9. Similarly, as shown by curve B, test structure 802R does not provide the nominal pad to pad resistance of R2, but rather provides a raised resistance RR2, thereby indicating that the actual width WR2 of test structure 802R is not equal to the nominal width W2. Actual width WR2 can be determined by finding the intersection of measured resistance RR2 and baseline curve A. The value of the misalignment between the diffusion and well layers can then be calculated by finding the difference between nominal width W2 and actual width WR2, indicated as increment mc in FIG. 9.

Because widths WL1–WL3 and widths WR1–WR3 are all adjusted by the same increment m, curves B and C have the same constant offsets from curve A, i.e., the horizontal distances between curves A and B (increment mb) and curves A and C (increment mc) are both equal to increment m. Consequently, the magnitude of the misalignment (increment m) between the well and diffusion layers can be calculated using either curve B or curve C. Alternatively, increment m can be calculated by halving the horizontal distance between curves B and C, i.e., since the horizontal distance between curves A and B is equal to increment m, and the horizontal distance between curves A and C is equal to increment m, the horizontal distance between curves B and C must be equal to twice increment m.

Various curve-fitting algorithms can be used to create characteristic curves B and C from the measured data points. The more data points (i.e., test structures) used to generate curves B and C, the more accurately the horizontal offset of the curves can be determined, and therefore the more accurately the layer to layer misalignment can be calculated. With a relatively large number of data points, reasonably accurate curves can be generated without using any curve-fitting by simply connecting the data points with straight lines.

Figure 10A:
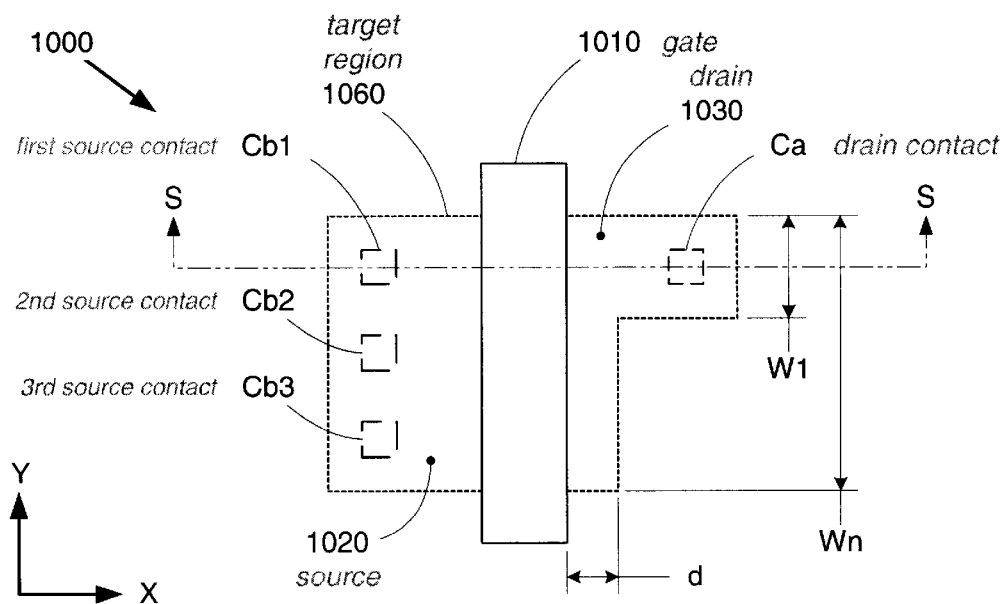
FIGS. 10a and 10b are diagrams of an electrical alignment test structure in accordance with another embodiment of the present invention.

FIG. 10a shows an electrical alignment test structure 1000 for measuring layer (or mask) misalignment in an IC in accordance with another embodiment of the present invention. Test structure 1000 comprises a target region 1060, contacts Ca, Cb1, Cb2, and Cb3 in a second layer, and an alignment feature 1010 in a third layer. Target region 1060 comprises doped regions 1020 and 1030 in a first layer. Note that descriptors such as "first" and "second" when used in conjunction with various IC layers do not necessarily indicate stacking order or formation order, but merely serve as differentiating designators.

Contact Ca provides electrical connectivity with doped region 1030, while contacts Cb1, Cb2, and Cb3 provide electrical connectivity with doped region 1020. Multiple contacts provide reduced contact resistance with the larger contact area of doped region 1020. While three contacts are shown for doped region 1020, any number could be used. Alternatively, a single large contact could replace the multiple contacts. The contact for doped region 1020 could also be the same size as the contact for doped region 1030.

Figure 10B:
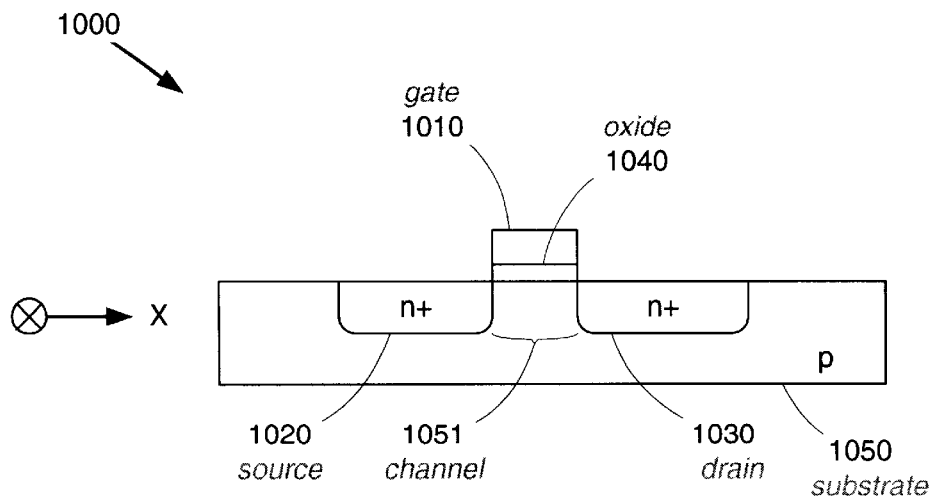

FIG. 10b shows a cross section S—S of test structure 1000 according to an embodiment of the present invention. Dielectric layer 1040 overlies a channel region 1051 in a substrate 1050 between doped regions 1020 and 1030. Alignment feature 1010 overlies a dielectric layer 1040 in a fourth layer. According to an embodiment of the present invention, dielectric layer 1040 is formed during the process steps used to form a gate oxide layer (i.e., the fourth layer), and alignment feature 1010 is formed during the process steps used to form a polysilicon layer (i.e., the third layer) of the IC. According to another embodiment of the present invention, alignment feature 1010 is formed during the process steps used to form a polycide gate structure of the IC.

Target region 1060 represents a defined area in substrate 1050 that is doped using a diffusion or ion implant process step performed after formation of alignment feature 1010. An N-type dopant is indicated in FIG. 10b, although a P-type dopant could just as well be used. Substrate 1050 is of the opposite dopant type, i.e., if substrate 1050 is a P-type material, target region 1060 is doped with an N-type dopant, and vice versa.

Where alignment feature 1010 overlies target region 1060, no doping of target region 1060 takes place. In this manner, doped regions 1020 and 1030 are formed in target region 1060. According to an aspect of the present invention, substrate 1050 comprises a doped well formed in a silicon wafer. According to another aspect of the present invention, substrate 1050 comprises the silicon wafer itself. The alignment of feature 1010 with respect to target region 1060 in the X-direction determines the relative sizes of doped regions 1020 and 1030.

Regions 1020 and 1030 act as a source and a drain, respectively, for test structure 1000, while alignment feature 1010 acts as a gate. Therefore, test structure 1000 functions as a MOS transistor. A threshold voltage Vg applied to alignment feature 1010 creates an inversion layer in the channel region of substrate 1050 between regions 1020 and 1030. A sufficient voltage differential between region 1030 (Vd) and region 1020 (Vs) then causes current to flow between the two.

As shown in FIG. 10a, regions 1020 and 1030 are not symmetrical. While source region 1020 has a substantially regular outline, drain region 1030 is "notched". The contact area of region 1030 has a reduced width W1, as compared with a nominal width Wn of region 1020. Consequently, as alignment feature 1010 is shifted in the positive X-direction with respect to target region 1060 (i.e., as distance d is reduced), the effective draw width of drain region 1030 begins to approach width W1. Therefore, as distance d is reduced, the current carrying capacity of test structure 1000 is correspondingly diminished, i.e., a threshold voltage on alignment feature 1010 produces a reduced current flow through test structure 1000. Conversely, as alignment feature 1010 is shifted in the negative X-direction with respect to target region 1060 (i.e., as distance d is increased), the effective draw width of drain region 1030 begins to approach width Wn, thereby increasing the current carrying capacity test structure 1000. By comparing the measured current between drain region 1030 and source region 1020 with a baseline (no misalignment) current, the direction of misalignment can be determined.

The "notched" drain region 1030 improves misalignment detection capability of test structure 1000 by making the change in current due to misalignment between the first and third layers more pronounced. The smaller the reduced width W1 in relation to the nominal width Wn, the greater the current change that will be produced for a given misalignment. Alternative outlines for regions 1020 and 1030, such as tapers or double notches, will be readily apparent.

Figure 11:
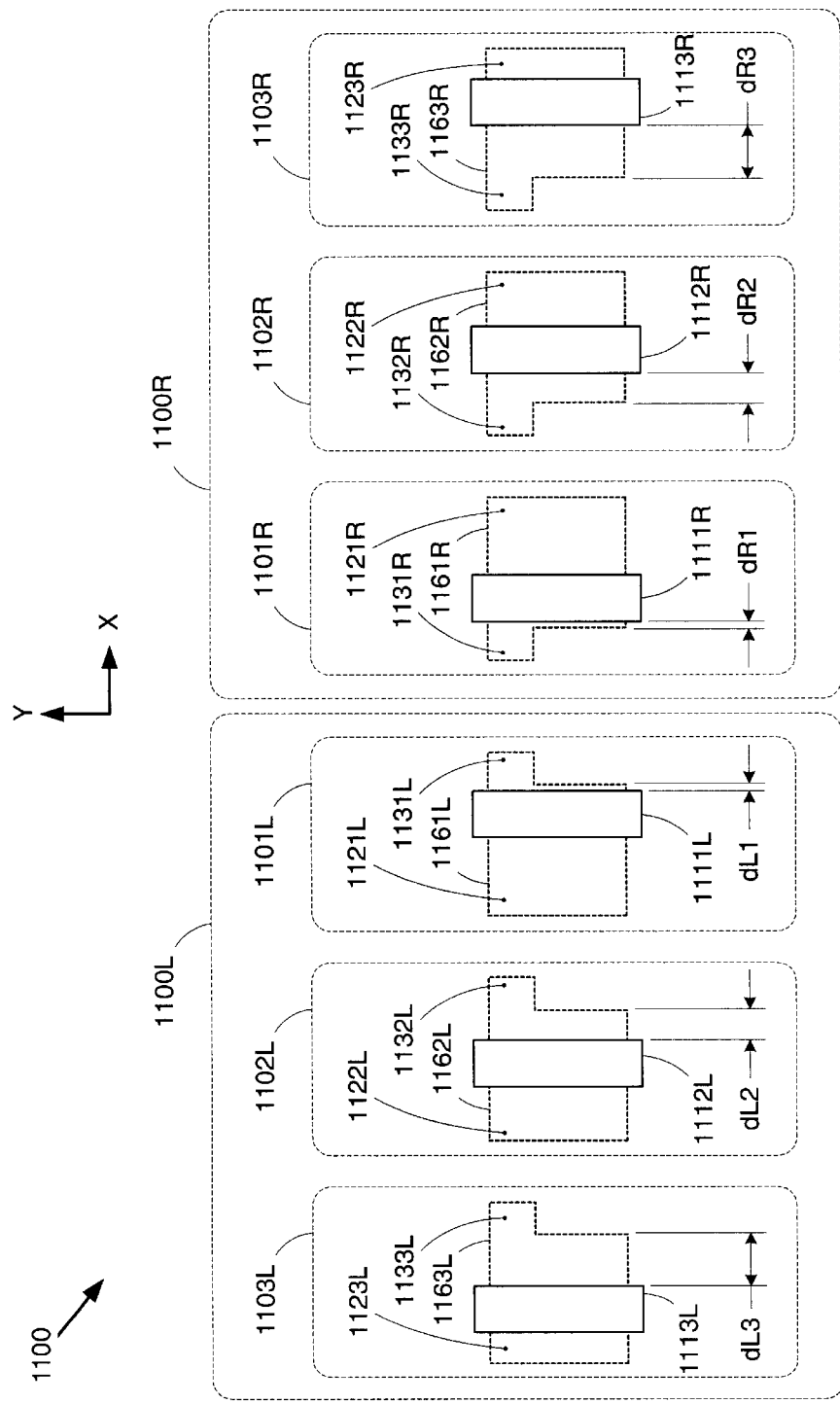
FIG. 11 is a diagram of an electrical alignment test array in accordance with another embodiment of the present invention.

FIG. 11 shows an alignment test structure array 1100 in accordance with another embodiment of the present invention. Array 1100 comprises a left half 1100L comprising test structures 1101L–1103L, and a right half 1100R comprising test structures 1101R–1103R. Each of test structures 1101L–1103L and 1101R–1103R is substantially similar to test structure 1000 shown in FIG. 10a. While three test structures have been shown in each half of array 1100, it is understood that any number of test structures could be included in array 1100.

Test structure 1101L comprises a target region 1161L comprising a source region 1121L and a drain region 1131L, both formed in a diffusion layer, and an alignment feature 1111L formed in a polysilicon layer and spaced a distance dL1 from an inner edge of drain region 1131L. Test structure 1102L comprises a target region 1162L comprising a source region 1122L and a drain region 1132L, both formed in a diffusion layer, and an alignment feature 1112L formed in a polysilicon layer and spaced a distance dL2 from an inner edge of drain region 1132L. Test structure 1103L comprises a target region 1163L comprising a source region 1123L and a drain region 1133L, both formed in a diffusion layer, and an alignment feature 1113L formed in a polysilicon layer and spaced a distance dL3 from an inner edge of drain region 1133L. Test structure 1101R comprises a target region 1161R comprising a source region 1121R and a drain region 1131R, both formed in a diffusion layer, and an alignment feature 1111R formed in a polysilicon layer and spaced a distance dR1 from an inner edge of drain region 1131R. Test structure 1102R comprises a target region 1162R comprising a source region 1122R and a drain region 1132R, both formed in a diffusion layer, and an alignment feature 1112R formed in a polysilicon layer and spaced a distance dR2 from an inner edge of drain region 1132R. Finally, test structure 1103R comprises a target region 1163R comprising a source region 1123R and a drain region 1133R, both formed in a diffusion layer, and an alignment feature 1113R formed in a polysilicon layer and spaced a distance dR3 from an inner edge of drain region 1133R.

Test structures 1101L–1103L are configured such that distance dL3 is greater than distance dL2 by a specific increment dx, and distance dL2 is greater than distance dL1 by the same specific increment dx. Similarly, test structures 1101R–1103R are configured such that distance dR3 is greater than distance dR2, and distance dR2 is greater than distance dR1, by that same specific increment dx. Furthermore, test structures 1101L–1103L and 1101R–1103R are configured such that when the polysilicon gate and diffusion layers align, distances dL1 and dR1 are equal, distances dL2 and dR2 are equal, and distances dL3 and dR3 are equal. Left half 1100L and right half 1100R of array 1100 therefore form mirror images of one another.

Each of test structures 1101L–1103L and 1101R–1103R is formed and operated in the same manner as test structure 1000 in FIGS. 10a and 10b to indicate X-direction (horizontal) misalignment between the polysilicon (gate) layer and the diffusion layer. An array similar to array 1100 can be oriented perpendicularly to array 1100 to provide Y-direction (vertical) misalignment detection capability. However, because array 1100 includes a series of test structures rather than a single structure, array 1100 enables the determination of the actual magnitude of misalignment between the two layers. Alignment features 1111L–1113L and 1111R–1113R are formed using the same mask, and therefore can be accurately positioned with respect to one another. Target regions 1161L–1163L and 1161R–1163R are also formed using a single mask, and can therefore attain a similar relative positional accuracy. Consequently, any misalignment between the polysilicon gate and diffusion layers adjusts each of distances dL1–dL3 and dR1–dR3 by the same amount. This uniform offset provides means for determining the misalignment between the polysilicon and diffusion layers.

Figure 12:
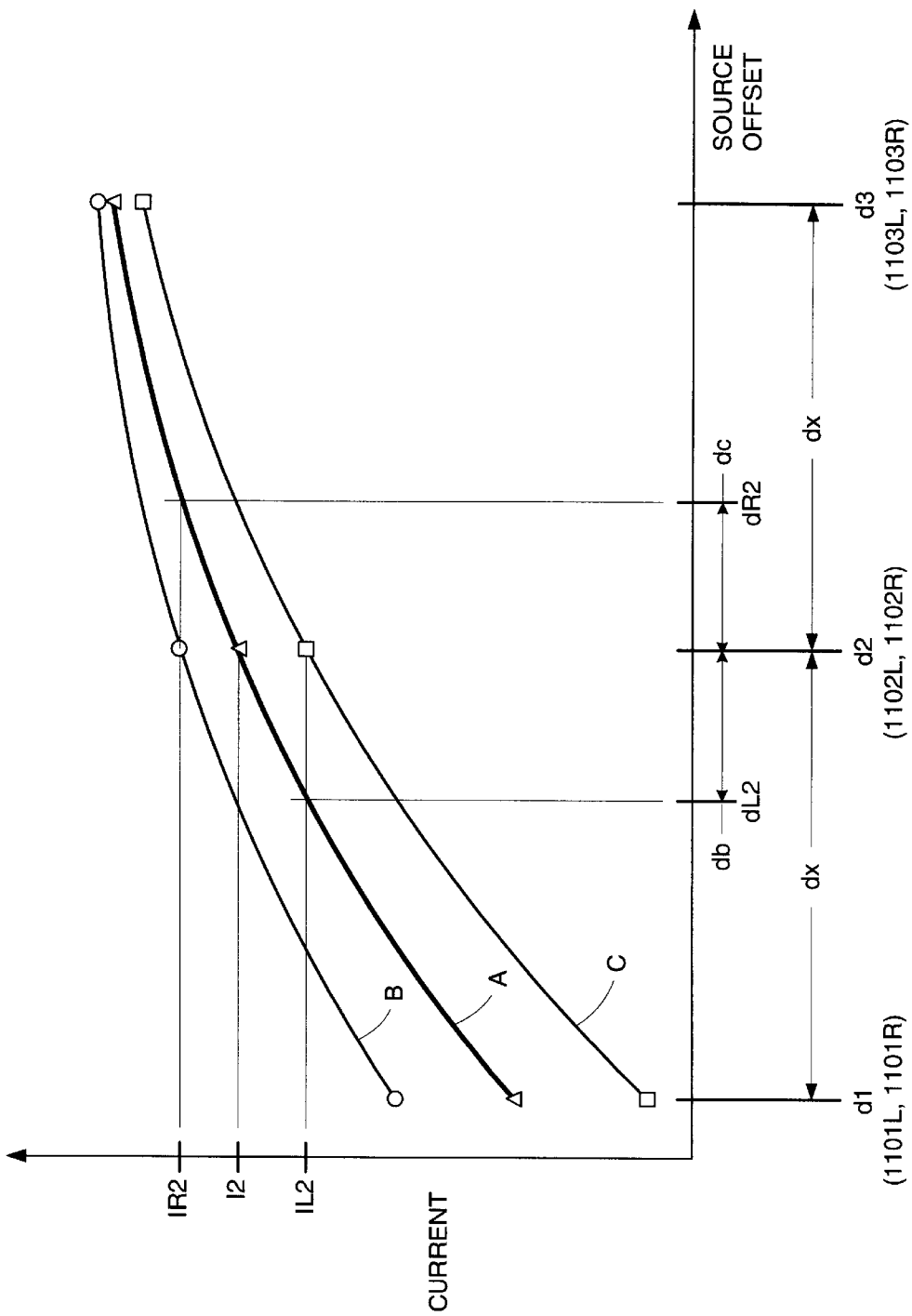
FIG. 12 is a graph of sample characteristic current curves for the electrical alignment test array of FIG. 11.

FIG. 12 shows a graph of characteristic current curves for left half 1100L and right half 1100R of array 1100 shown in FIG. 11. The characteristic curves plot current flow versus gate alignment (with the target region) for the test structures in the left and right halves of array 1100. Because the two halves are mirror images of each other, corresponding test structures share the same horizontal axis points (i.e., test structures 1101L and 1101R share a single horizontal axis point, as do test structures 1102L and 1102R, and test structures 1103L and 1103R). When there is no misalignment, overlap distances dL1 and dR1 are equal to a nominal distance d1, and thus the current flows through test structures 1101L and 1101R are equal. Similarly, distances dL2 and dR2, which are greater than distances dL1 and dR1, respectively, by increment dx, are both equal to a nominal distance d2, and thus the current flows through test structures 1102L and 1102R are equal. Finally, distances dL3 and dR3, which are greater than distances dL2 and dR2, respectively, by increment dx, are equal to a nominal distance d3, and thus the current flows through test structures 1103L and 1103R are equal. Therefore, when the polysilicon (gate) and diffusion layers are aligned, left half 1100L and right half 1100R share the same baseline characteristic curve A.

However, if the polysilicon and diffusion layers are misaligned, then all the distances in left half 1100L are shifted by a misalignment increment m in one direction, and all the distances in right half 1100R are shifted by increment m in the opposite direction. For example, if the polysilicon layer in FIG. 11 is shifted by an increment m in the positive X-direction (rightward) with respect to the diffusion layer, each of distances dL1–dL3 would be decreased by increment m while each of distances dR1–dR3 would be increased by increment m. The decrease in distances dL1–dL3 would cause a corresponding decrease in the current flows of test structures 1101L–1103L, respectively, thereby resulting in curve C of FIG. 12. At the same time, the increase in distances dR1–dR3 would cause a corresponding increase in the current flows of test structures 1101R–1103R, respectively, thereby resulting in curve B of FIG. 12.

Once created, curves B and C can be used to determine the amount of misalignment between the gate and diffusion layers. For example, as shown by curve C, test structure 1102L does not provide the nominal current flow of I2, but rather provides a lowered current IL2, thereby indicating that the actual distance dL2 of test structure 1102L is not equal to the nominal distance d2. Actual distance dL2 can be determined by finding the intersection of measured current IL2 and baseline curve A. The value of the misalignment between the polysilicon and diffusion layers can then be calculated by finding the difference between nominal distance d2 and actual distance dL2, indicated as increment db in FIG. 12. Similarly, as shown by curve B, test structure 1102R does not provide the nominal current flow I2, but rather provides a raised current IR2, thereby indicating that the actual distance dR2 of test structure 1102R is not equal to the nominal distance d2. Actual distance dR2 can be determined by finding the intersection of measured current IR2 and baseline curve A. The value of the misalignment between the polysilicon and diffusion layers can then be calculated by finding the difference between nominal distance d2 and actual distance dR2, indicated as increment dc in FIG. 12.

Because distances dL1–dL3 and distances dR1–dR3 are all adjusted by the same increment dx, curves B and C have the same constant offsets from curve A, i.e., the horizontal distances between curves A and B (increment db) and curves A and C (increment dc) are both equal to increment dx. Consequently, the magnitude of the misalignment (increment dx) between the polysilicon and diffusion layers can be calculated using either curve B or curve C. Alternatively, increment dx can be calculated by halving the horizontal distance between curves B and C, i.e., since the horizontal distance between curves A and B is equal to increment dx, and the horizontal distance between curves A and C is equal to increment dx, the horizontal distance between curves B and C must be equal to twice increment dx.

Various curve-fitting algorithms can be used to create characteristic curves B and C from the measured data points. The more data points (i.e., test structures) used to generate curves B and C, the more accurately the horizontal offset of the curves can be determined, and therefore the more accurately the layer to layer misalignment can be calculated. With a relatively large number of data points, reasonably accurate curves can be generated without using any curve-fitting by simply connecting the data points with straight lines.

Figure 13A:
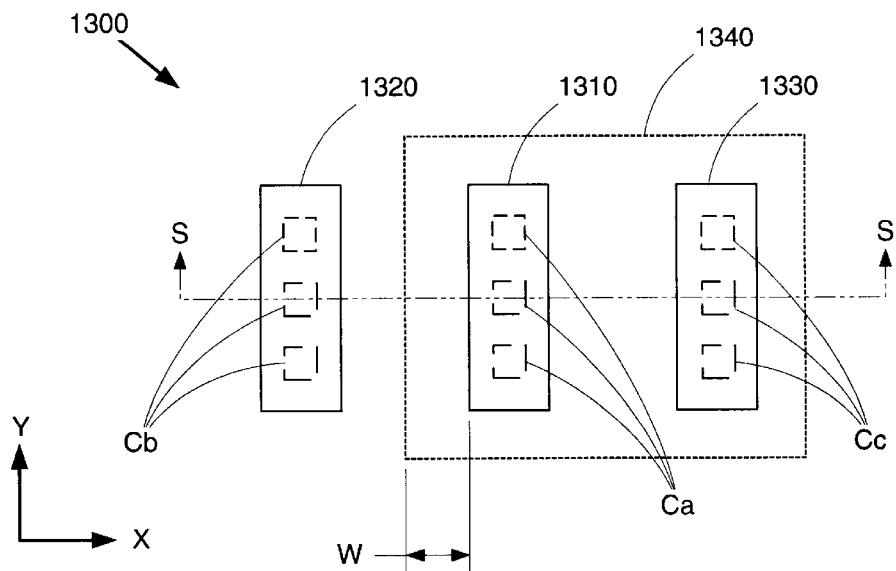
FIGS. 13a and 13b are diagrams of an electrical alignment test structure in accordance with another embodiment of the present invention.

FIG. 13a shows an electrical alignment test structure 1300 for measuring layer (or mask) misalignment in an IC in accordance with another embodiment of the present invention. Test structure 1300 comprises a target region 1340 in a first layer, a plurality of contacts Ca, Cb, and Cc in a second layer, an alignment region 1310 and a doped region 1320 in a third layer, and a doped region 1330 in a fourth layer. Note that descriptors such as "first" and "second" when used in conjunction with various IC layers do not necessarily indicate stacking order or formation order, but merely serve as differentiating designators.

Contacts Ca, Cb, and Cc provide electrical connectivity with region 1310, 1320, and 1330, respectively. Multiple contacts provide reduced contact resistance to maximize signal transfer through test structure 1300. While three contacts are shown for each of regions 1310, 1320, and 1330, any number of contacts could be used for each of the regions.

Figure 13B:
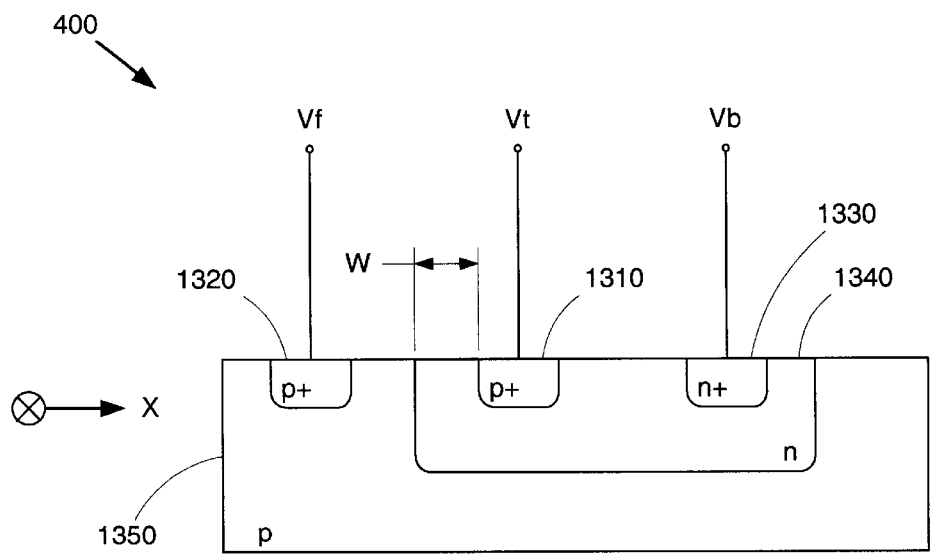

FIG. 13b shows a cross section S—S of test structure 1300 according to an embodiment of the present invention. Target region 1340 represents a defined area in a substrate 1350 that is doped using a diffusion or ion implant process step to form a well. The first layer is sometimes designated the "well layer". N-type doping for target region 1340 is indicated in FIG. 13b, although P-type doping could just as well be used. Region 1330 is a more heavily doped portion of target region 1340, thereby providing improved electrical connectivity with contacts Cc (not shown for clarity). Substrate 1350 is of the opposite dopant type, i.e., if substrate 1350 is a P-type material, target region 1340 is doped with an N-type dopant, and vice versa. Finally, regions 1310 and 1320 are of the opposite dopant type than target region 1340, and are formed in what is often designated the "diffusion layer", even though the actual doping may be done by implant rather than diffusion. As shown in FIG. 13b, when target region 1340 is N-type, regions 1310 and 1320 are P-type. Region 1320 is formed in substrate 1350 to provide improved electrical connectivity with contacts Cb (not shown for clarity), while alignment region 1310 is formed in target region 1340.

Alignment region 1310 and target region 1340 form an interface diode at their pn junction. If the diode is reverse biased, only a small leakage current (i.e., reverse saturation current) will flow through that junction. Therefore, the reverse bias current carrying capacity of test structure 1300 is low. Because alignment region 1310 is P-type and target region 1340 is N-type, the interface diode between the two can be reverse biased when contacts Ca are coupled to ground and contacts Cc are coupled to a positive voltage. Alternatively, contacts Cc could be grounded and contacts Ca could be coupled to a negative voltage.

Alignment region 1310 is spaced a width W in the X-direction from an edge of target region 1340. When width W is sufficiently large, the reverse bias current flow through alignment region 1310 is purely the leakage current through the interface diode. However, as width W is reduced, additional current can flow to substrate 1350. Under reverse bias, a depletion region in target region 1340 is formed under alignment region 1310. As alignment region 1310 approaches the edge of target region 1340, the depletion region begins to interact with substrate 1350. By coupling contacts Cb to the same voltage as contacts Cc, current flow can be enabled between alignment region 1310 and substrate 1350 (i.e., current carrying capacity is increased). The alignment of region 1310 with target region 1340 in the X-direction therefore determines the magnitude of the current flow through alignment region 1310.

Figure 14:
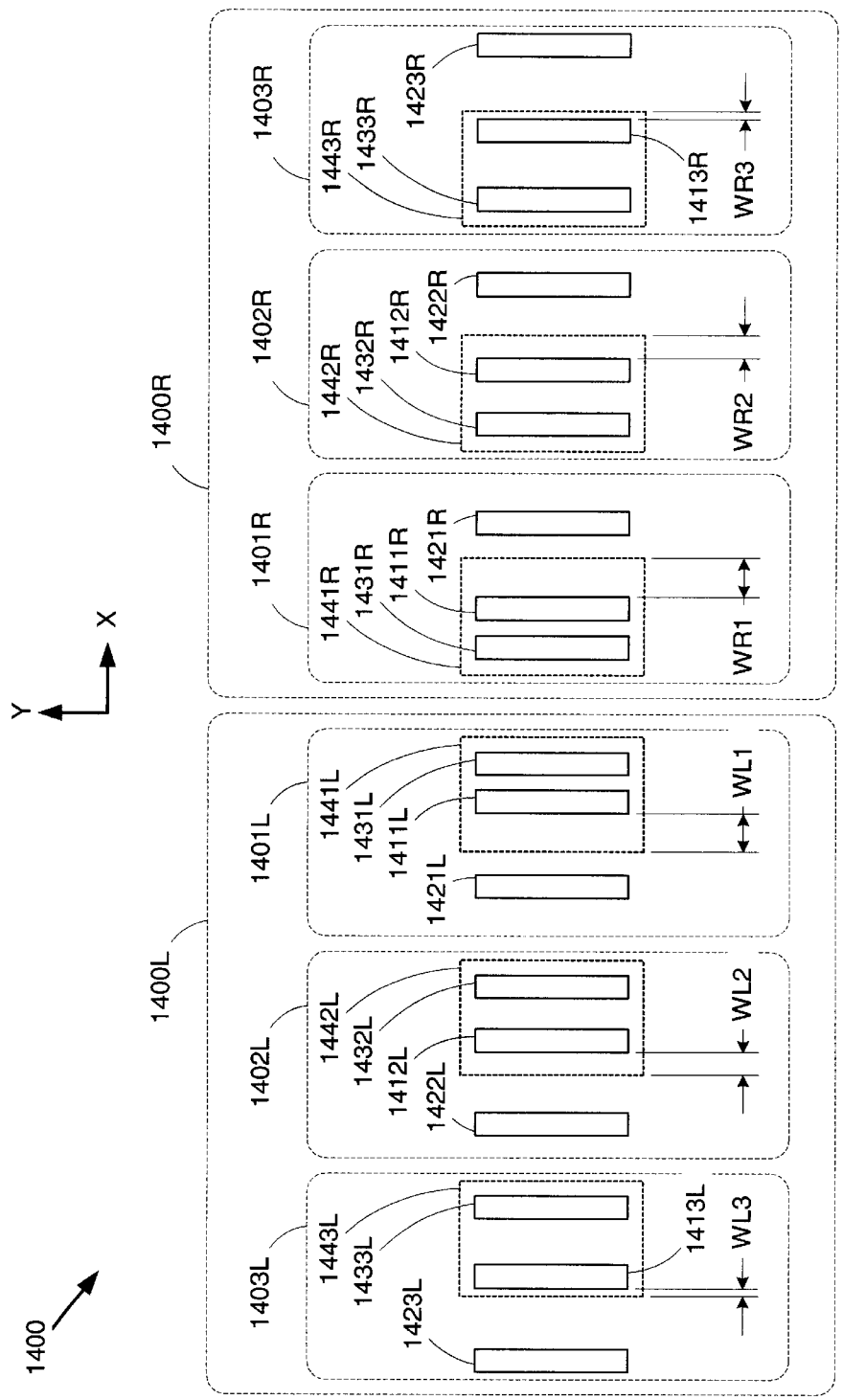
FIG. 14 is a diagram of an electrical alignment test array in accordance with another embodiment of the present invention.

FIG. 14 shows an alignment test structure array 1400 in accordance with another embodiment of the present invention. Array 1400 comprises a left half 1400L comprising test structures 1401L–1403L, and a right half 1400R comprising test structures 1401R–1403R. Each of test structures 1401L–1403L and 1401R–1403R is substantially similar to test structure 1300 (FIG. 13a). While three test structures have been shown in each half of array 1400, it is understood that any number of test structures could be included in array 1400.

Test structure 1401L comprises a target region 1441L formed in a well layer (first layer), a doped region 1431L and an oppositely doped alignment region 1411L, both formed within target region 1441L, and a doped region 1421L formed outside target region 1441L. Both regions 1411L and 1421L (and region 1431L) are formed in a diffusion layer (third layer), with alignment region 1411L being spaced a width WL1 from the edge of target region 1441L. Test structure 1402L comprises a target region 1442L formed in the well layer, a doped region 1432L and an oppositely doped alignment region 1412L, both formed within target region 1442L, and a doped region 1422L formed outside target region 1442L. Both regions 1412L and 1422L (and region 1432L) are formed in the diffusion layer, with alignment region 1412L being spaced a width WL2 from the edge of target region 1442L. Test structure 1403L comprises a target region 1443L formed in the well layer, a doped region 1433L and an oppositely doped alignment region 1413L, both formed within target region 1443L, and a doped region 1423L formed outside target region 1443L. Both regions 1413L and 1423L (and region 1433L) are formed in the diffusion layer, with alignment region 1413L being spaced a width WL3 from the edge of target region 1443L. Test structure 1401R comprises a target region 1441R formed in the well layer, a doped region 1431R and an oppositely doped alignment region 1411R, both formed within target region 1441R, and a doped region 1421R formed outside target region 1441R. Both regions 1411R and 1421R (and region 1431R) are formed in the diffusion layer, with alignment region 1411R being spaced a width WR1 from the edge of target region 1441R. Test structure 1402R comprises a target region 1442R formed in the well layer, a doped region 1432R and an oppositely doped alignment region 1412R, both formed within target region 1442R, and a doped region 1422R formed outside target region 1442R. Both regions 1412R and 1422R (and region 1432R) are formed in the diffusion layer, with alignment region 1412R being spaced a width WR2 from the edge of target region 1442R. Finally, test structure 1403R comprises a target region 1443R formed in the well layer, a doped region 1433R and an oppositely doped alignment region 1413R, both formed within target region 1443R, and a doped region 1423R formed outside target region 1443R. Both regions 1413R and 1423R (and region 1433R) are formed in the diffusion layer, with alignment region 1413R being spaced a width WR3 from the edge of target region 1443R.

Test structures 1401L–1403L are configured such that width WL3 is less than width WL2 by a specific increment d, and width WL2 is less than width WL1 by the same specific increment d. Similarly, test structures 1401R–1403R are configured such that width WR3 is less than width WR2, and width WR2 is less than width WR1, by that same specific increment d. Furthermore, test structures 1401L–1403L and 1401R–1403R are configured such that when the diffusion and well layers align, widths WL1 and WR1 are equal, widths WL2 and WR2 are equal, and widths WL3 and WR3 are equal. Left half 1400L and right half 1400R of array 1400 therefore form mirror images of one another.

Each of test structures 1401L–1403L and 1401R–1403R is formed and operated in the same manner as test structure 1300 in FIGS. 13a and 13b to indicate X-direction (horizontal) misalignment between the well layer and the diffusion layer. An array similar to array 1400 can be oriented perpendicularly to array 1400 to provide Y-direction (vertical) misalignment detection capability. However, because array 1400 includes a series of test structures rather than a single structure, array 1400 enables the determination of the actual magnitude of misalignment between the two layers. Alignment regions 1411L–1413L and 1411R–1413R are formed using the same mask, and therefore can be accurately positioned with respect to one another. Target regions 1441L–1443L and 1441R–1443R are also formed using a single mask, and can therefore attain a similar relative positional accuracy. Consequently, any misalignment between the well and diffusion layers adjusts each of widths WL1–WL3 and WR1–WR3 by the same amount. This uniform offset provides means for determining the misalignment between the well and diffusion layers.

Figure 15:
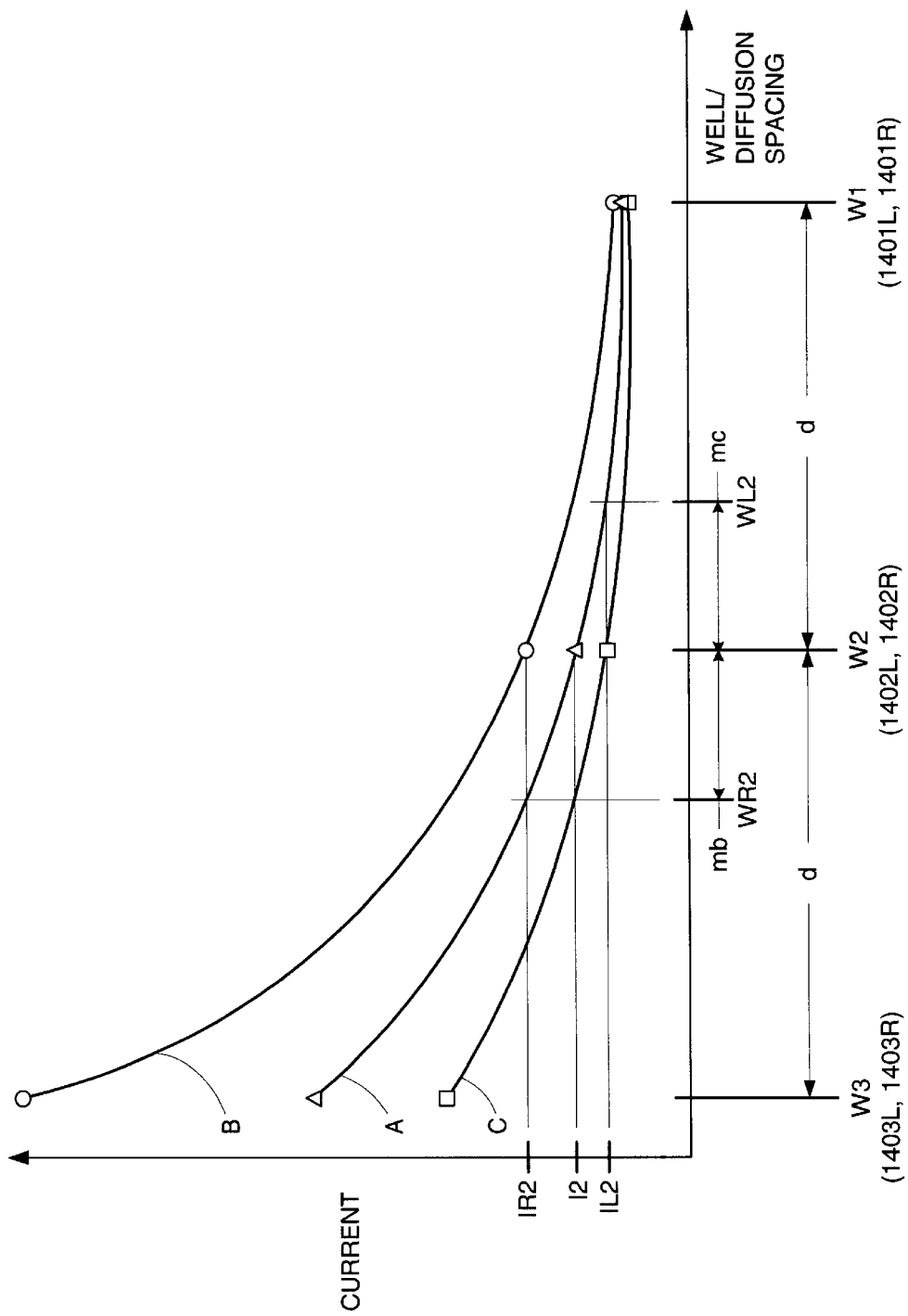
FIG. 15 is a graph of sample characteristic current curves for the electrical alignment test array of FIG. 14.

FIG. 15 shows a graph of characteristic leakage current curves for left half 1400L and right half 1400R of array 1400 (FIG. 14). The characteristic curves plot current flow versus diffusion/well layer alignment for the test structures in the left and right halves of array 1400. Because the two halves are mirror images of each other, corresponding test structures share the same horizontal axis points (i.e., test structures 1401L and 1401R share a single horizontal axis point, as do test structures 1402L and 1402R, and test structures 1403L and 1403R). When there is no misalignment, widths WL1 and WR1 are equal to a nominal distance W1, and thus the current flows through test structures 1401L and 1401R are equal. Similarly, widths WL2 and WR2, which are smaller than widths WL1 and WR1, respectively, by increment d, are both equal to a nominal distance W2, and thus the current flows through test structures 1402L and 1402R are equal. Finally, widths WL3 and WR3, which are smaller than widths WL2 and WR2, respectively, by increment d, are equal to a nominal distance W3, and thus the current flows through test structures 1403L and 1403R are equal. Therefore, when the well and diffusion layers are aligned, left half 1400L and right half 1400R share the same baseline characteristic curve A.

However, if the well and diffusion layers are misaligned, all the distances in left half 1400L are shifted by a misalignment increment in one direction, and all the distances in right half 1400R are shifted by the same misalignment increment in the opposite direction. For example, if the diffusion layer in FIG. 14 is shifted by an increment m in the positive X-direction (rightward) with respect to the well layer, each of widths WL1–WL3 would be increased by increment m while each of widths WR1–WR3 would be decreased by increment m. The increase in widths WL1–WL3 would cause a corresponding decrease in the current flows of test structures 1401L–1403L, respectively, thereby resulting in curve C of FIG. 15. At the same time, the decrease in widths WR1–WR3 would cause a corresponding increase in the current flows of test structures 1401R–1403R, respectively, thereby resulting in curve B of FIG. 15.

Once created, curves B and C can be used to determine the amount of misalignment between the well and diffusion layers. For example, as shown by curve C, test structure 1402L does not provide the nominal current flow of I2, but rather provides a lowered current IL2, thereby indicating that the actual width WL2 of test structure 1402L is not equal to the nominal width W2. Actual width WL2 can be determined by finding the intersection of measured current IL2 and baseline curve A. The value of the misalignment between the well and diffusion layers can then be calculated by finding the difference between nominal width W2 and actual width WL2, indicated as increment mc in FIG. 15. Similarly, as shown by curve B, test structure 1402R does not provide the nominal current flow I2, but rather provides a raised current IR2, thereby indicating that the actual width WR2 of test structure 1402R is not equal to the nominal width W2. Actual width WR2 can be determined by finding the intersection of measured current IR2 and baseline curve A. The value of the misalignment between the well and diffusion layers can then be calculated by finding the difference between nominal width W2 and actual width WR2, indicated as increment mb in FIG. 15.

Because widths WL1–WL3 and widths WR1–WR3 are all adjusted by the same increment m, curves B and C have the same constant offsets from curve A, i.e., the horizontal distances between curves A and B (increment mb) and curves A and C (increment mc) are both equal to increment m. Consequently, the magnitude of the misalignment (increment m) between the well and diffusion layers can be calculated using either curve B or curve C. Alternatively, increment m can be calculated by halving the horizontal distance between curves B and C, i.e., since the horizontal distance between curves A and B is equal to increment m, and the horizontal distance between curves A and C is equal to increment m, the horizontal distance between curves B and C must be equal to twice increment m.

Various curve-fitting algorithms can be used to create characteristic curves B and C from the measured data points. The more data points (i.e., test structures) used to generate curves B and C, the more accurately the horizontal offset of the curves can be determined, and therefore the more accurately the layer to layer misalignment can be calculated. With a relatively large number of data points, reasonably accurate curves can be generated without using any curve-fitting by simply connecting the data points with straight lines.

Thus, an electrical alignment test structure for electrically isolated layers has been described. Although the invention has been described in connection with several embodiments, it is understood that this invention is not limited to the embodiments disclosed, but is capable of various modifications which would be apparent to a person skilled in the art. For example, alignment feature 410 of test structure 400 could be made much wider, such that target region 420 would only have a single doped region (conductive channel 420*c*) and a single undoped region 420*b* (i.e., no conductive channel 420*a*). In addition, the alignment test structures of test structure array 1100 could be arranged in a non-mirror image configuration, as long as each "left" alignment test structure is mirrored by a corresponding "right" alignment test structure. Thus, the invention is limited only by the following claims.

What is claimed is:

1. A method for measuring misalignment between a first layer and a second layer in an integrated circuit (IC), the method comprising the steps of:

forming a first plurality of alignment test structures, each of the first plurality of alignment test structures being configured to have a different baseline spacing in a first direction between a first alignment feature in the first layer and a first reference feature in the second layer when the first layer and the second layer are aligned in the first direction, wherein a first device performance parameter of each of the first plurality of alignment test structures is controlled by the actual spacing between the first alignment feature and the first reference feature;

forming a second plurality of alignment test structures, each of the second plurality of alignment test structures being configured to be a mirror image of a corresponding one of the first plurality of alignment test structures about an axis of symmetry in a second direction when the first layer is aligned with the second layer in the first direction, the second direction being substantially perpendicular to the first direction, such that each of the second plurality of alignment test structures is configured to have a second baseline spacing in the first direction between a second alignment feature in the first layer and a second reference feature in the second layer substantially equal to a first baseline spacing of the corresponding one of the first plurality of alignment test structures, wherein a second device performance parameter of each of the second plurality of alignment test structures is controlled by the actual spacing between the second alignment feature and the second reference feature;

measuring a first device performance parameter for each of the first plurality of alignment test structures;

measuring a second device performance parameter for each of the second plurality of alignment test structures;

graphing the first device performance parameter versus the first baseline spacing for each of the first plurality of alignment test structures to create a first characteristic curve;

graphing the second device performance parameter versus the second baseline spacing for each of the second plurality of alignment test structures to create a second characteristic curve;

Determining the amount of misalignment between the first layer and the second layer by having a horizontal offset between the first characteristic curve and the second characteristic curve.

2. The method of claim 1 wherein the first layer comprises a polysilicon layer and the second layer comprises a diffusion layer, and wherein the first device performance parameter and the second device performance parameter comprises current flow.

3. The method of claim 2, wherein the first reference feature in each of the first plurality of alignment test structures and the second reference feature in each of the second plurality of alignment test structures comprises a target region in the diffusion layer, and wherein the first alignment feature in each of the first plurality of alignment test structures and the second alignment feature in each of the second plurality of alignment test structures comprises a polysilicon structure formed over the target region, wherein the target regions of the first plurality of alignment test structures and the second plurality of alignment test structures are doped after formation of the alignment features to form a conductive channel in each alignment test structure.

4. The method of claim 3, further comprising the step of applying a voltage across the conductive channel in each of the first plurality of alignment test structures and the second plurality of alignment test structures to determine current flow across each of the alignment test structures.

5. The method of claim 1, wherein the first reference feature in each of the first plurality of alignment test structures and the second reference feature in each of the second plurality of alignment test structures comprises a doped region in a well layer, wherein the first alignment feature in each of the first plurality of alignment test structures and the second alignment feature in each of the second plurality of alignment test structures is formed over a portion of a target region, wherein in each of the first plurality of alignment test structures and each of the second plurality of alignment test structures, a field oxide is formed over all portions of the target region not covered by the alignment feature, forming a conductive channel in each of the alignment test structures, and wherein the first device performance parameter and the second device performance parameter comprise current flow.

6. The method of claim 5, wherein the first alignment feature in each of the first plurality of alignment test structures and the second alignment feature in each of the second plurality of alignment test structures comprises a diffusion region formed in a diffusion layer.

7. The method of claim 5, wherein the first alignment feature in each of the first plurality of alignment test structures and the second alignment feature in each of the second plurality of alignment test structures comprises a gate oxide formed in a gate oxide layer.

8. The method of claim 5, further comprising the step of applying a voltage across the conductive channel in each of the first plurality of alignment test structures and the second plurality of alignment test structures to determine the current flow across each alignment test structure.

9. The method of claim 1 wherein the first layer comprises a polysilicon layer and the second layer comprises a diffusion layer, and wherein the first device performance parameter and the second device performance parameter comprise current carrying capacities.

10. The method of claim 9, wherein the first alignment feature in each of the first plurality of alignment test structures and the second alignment feature in each of the second plurality of alignment test structures comprises a polysilicon structure formed over a target region in the second layer, wherein the target regions of the first plurality of alignment test structures and the second plurality of alignment test structures are doped after formation of the alignment features in the first plurality of alignment test structures and the second plurality of alignment test structures to form a source, drain and channel in each of the alignment test structures, and wherein the first reference feature in each of the first plurality of alignment test structures and the second reference feature in each of the second plurality of alignment test structures comprises a reduced width portion of a drain region formed within the target region.

11. The method of claim 10, further comprising the steps of:

applying a control voltage to the alignment feature of each of the first plurality of alignment test structures and the second plurality of alignment test structures;

applying a voltage potential between the source and drain of each of the first plurality of alignment test structures and the second plurality of alignment test structures; and measuring the current flow through each of the first plurality of alignment test structures and the second plurality of alignment test structures.

12. The method of claim 1 wherein the first layer comprises a diffusion layer and the second layer comprises a well layer, and wherein the first device performance parameter and the second device performance parameter comprise current carrying capacities.

13. The method of claim 12, wherein the first reference feature in each of the first plurality of alignment test structures and the second reference feature in each of the second plurality of alignment test structures comprises a target region in the well layer, and wherein the first alignment feature in each of the first plurality of alignment test structures and the second alignment feature in each of the second plurality of alignment test structures comprises a doped region formed within the target region, the doped region being of the opposite dopant type from the target region, thereby forming a diode in each of the first plurality of alignment test structures and the second plurality of alignment test structures.

14. The method of claim 10, further comprising the steps of:

reverse biasing the diode in each of the first plurality of alignment test structures and the second plurality of alignment test structures; and measuring the current flow through each of the first plurality of alignment test structure and the second plurality of alignment test structures.

* * * * *